(12) United States Patent
Cho et al.

(10) Patent No.: US 12,432,992 B2
(45) Date of Patent: Sep. 30, 2025

(54) SEMICONDUCTOR DEVICE INCLUDING SOURCE/DRAIN PATTERNS

(71) Applicant: Samsung Electronics Co., Ltd., Suwon-si (KR)

(72) Inventors: Keun Hwi Cho, Suwon-si (KR); Myung Gil Kang, Suwon-si (KR); Gibum Kim, Hwaseong-si (KR); Dongwon Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 445 days.

(21) Appl. No.: 18/057,986

(22) Filed: Nov. 22, 2022

(65) Prior Publication Data

US 2023/0299139 A1 Sep. 21, 2023

(30) Foreign Application Priority Data

Mar. 15, 2022 (KR) ........................ 10-2022-0031777

(51) Int. Cl.
 *H10D 62/13* (2025.01)
 *B82Y 10/00* (2011.01)
 (Continued)

(52) U.S. Cl.
 CPC ......... *H10D 62/151* (2025.01); *H10D 30/014* (2025.01); *H10D 30/43* (2025.01);
 (Continued)

(58) Field of Classification Search
 CPC ............. H10D 84/017; H10D 84/0186; H10D 30/797; H10D 64/258; H10D 84/0149; H10D 30/6713; H10D 62/151; H10D 30/014; H10D 30/43; H10D 84/0167; H10D 30/6757; H10D 64/256; H10D 30/6735; H10D 62/121; H10D 84/85; H10D 84/856; H10D 30/6729; H10D 64/017; H10D 84/83; H10D 84/0128; H10D 84/0172
 See application file for complete search history.

(56) References Cited

U.S. PATENT DOCUMENTS 7,644,388 B1 1/2010 Daldoss et al.
8,296,691 B2 10/2012 Chidambarrao et al.
(Continued)

FOREIGN PATENT DOCUMENTS

KR 100929628 B1 12/2009
KR 101819057 B1 1/2018
(Continued)

*Primary Examiner* — Sonya McCall-Shepard
(74) *Attorney, Agent, or Firm* — Fish & Richardson P.C.

(57) ABSTRACT

A semiconductor device includes an active region on a substrate, source/drain patterns on the active region, channel patterns on the active region and connected to the source/drain patterns, each of the channel patterns including a plurality of semiconductor patterns, which are vertically stacked to be spaced apart from each other, gate electrodes, which are respectively on the channel patterns and are extended in a first direction and parallel to each other, and active contacts, which are electrically and respectively connected to the source/drain patterns. A bottom surface of a first active contact is located at a first level, and a bottom surface of a second active contact is located at a second level higher than the first level. A bottom surface of a third active contact is located at a third level higher than the second level.

20 Claims, 32 Drawing Sheets

(51) Int. Cl.
*H10D 30/01* (2025.01)
*H10D 30/43* (2025.01)
*H10D 30/62* (2025.01)
*H10D 30/67* (2025.01)
*H10D 30/69* (2025.01)
*H10D 62/10* (2025.01)
*H10D 62/822* (2025.01)
*H10D 64/01* (2025.01)
*H10D 64/23* (2025.01)
*H10D 84/01* (2025.01)
*H10D 84/03* (2025.01)
*H10D 84/83* (2025.01)
*H10D 84/85* (2025.01)

(52) U.S. Cl.
CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/038* (2025.01); *H10D 84/85* (2025.01)

(56) References Cited

U.S. PATENT DOCUMENTS

| | | | |
|---|---|---|---|
| 8,816,444 | B2 | 8/2014 | Wann et al. |
| 10,748,911 | B2 | 8/2020 | Singh et al. |
| 2008/0117668 | A1 | 5/2008 | Chang |
| 2012/0119300 | A1 | 5/2012 | Kim et al. |
| 2013/0037888 | A1 | 2/2013 | Han et al. |
| 2013/0242645 | A1 | 9/2013 | Calhoun et al. |
| 2021/0151426 | A1 | 5/2021 | Chae et al. |

FOREIGN PATENT DOCUMENTS

| | | |
|---|---|---|
| KR | 101865840 B1 | 6/2018 |
| KR | 101914798 B1 | 11/2018 |
| KR | 10-2021-0060695 A | 5/2021 |

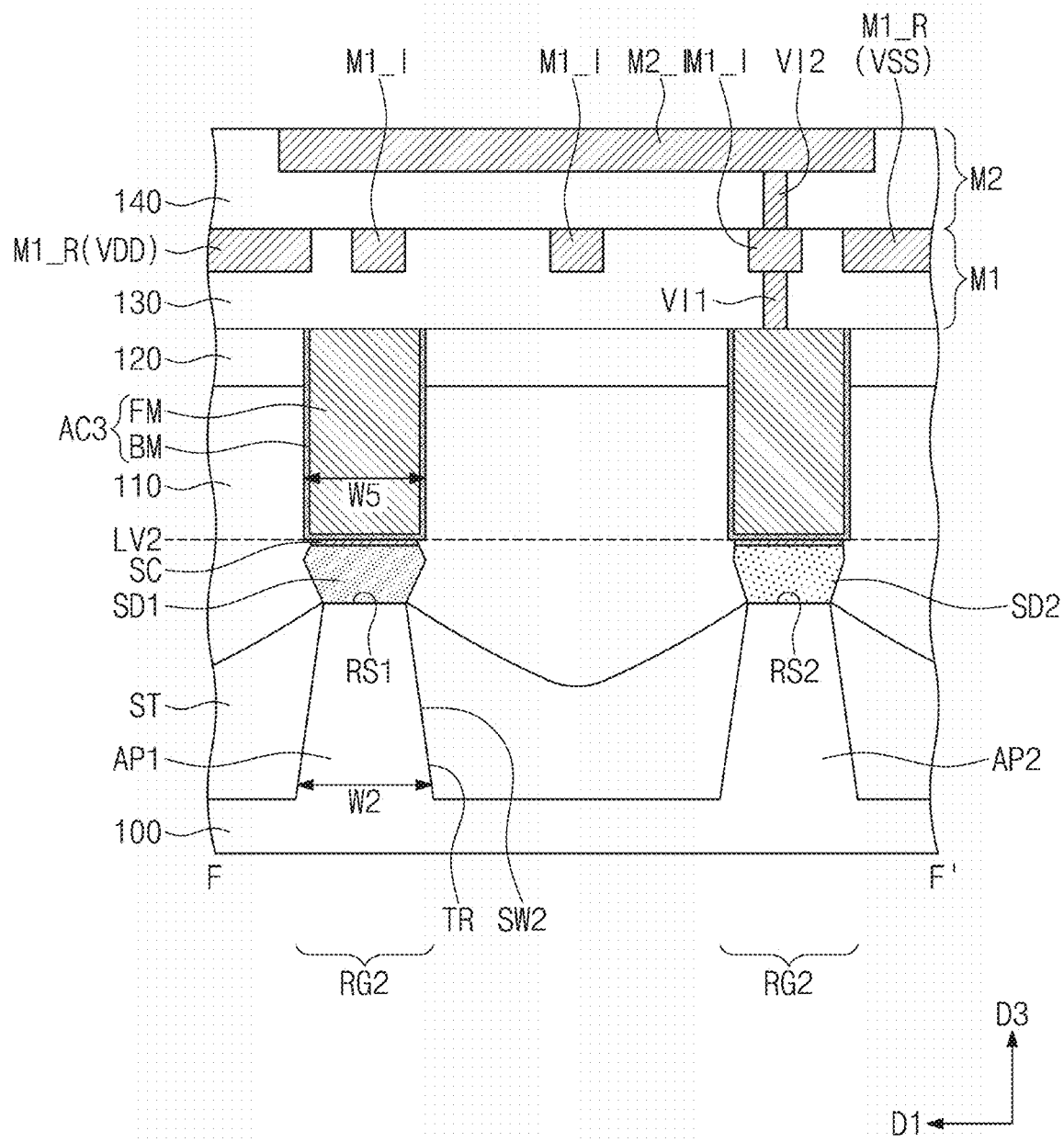

SEMICONDUCTOR DEVICE INCLUDING SOURCE/DRAIN PATTERNS

CROSS-REFERENCE TO RELATED APPLICATIONS

This U.S. non-provisional patent application claims priority under 35 U.S.C. § 119 to Korean Patent Application No. 10-2022-0031777, filed on Mar. 15, 2022, in the Korean Intellectual Property Office, the entire contents of which are hereby incorporated by reference.

BACKGROUND OF THE INVENTION

The present disclosure relates to a semiconductor device and/or a method of fabricating the same, and in particular, to a semiconductor device including a field effect transistor and/or a method of fabricating the same.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

Some example embodiments of the inventive concepts provide a semiconductor device with improved reliability and electric characteristics.

Some example embodiments of the inventive concepts provide a method of fabricating a semiconductor device with improved reliability and electric characteristics.

According to some example embodiments of the inventive concepts, a semiconductor device may include an active region on a substrate, source/drain patterns on the active region, channel patterns on the active region and connected to the source/drain patterns, each of the channel patterns including a plurality of semiconductor patterns, which are vertically stacked to be spaced apart from each other, gate electrodes, which are respectively on the channel patterns and are extended in a first direction and parallel to each other, and active contacts electrically and respectively connected to the source/drain patterns. The active region may include a first region having a first width, a second region having a second width, and a third region having a third width. The first width may be larger than the third width, and the third width may be larger than the second width. The third region may be interposed between the first region and the second region. The source/drain patterns may include a first source/drain pattern, a second source/drain pattern, and a third source/drain pattern on the first to third regions, respectively. The active contacts may include a first active contact, a second active contact, and a third active contact respectively and electrically connected to the first to third source/drain patterns. A bottom surface of the first active contact may be located at a first level, and a bottom surface of the second active contact may be located at a second level higher than the first level. A bottom surface of the third active contact may be located at a third level higher than the second level.

According to some example embodiments of the inventive concepts, a semiconductor device may include a first active region and a second active region on a substrate, each of the first and second active regions including a first region having a first width, a second region having a second width, and a third region having a third width, the first width being larger than the third width, the third width being larger than the second width, the third region being interposed between the first region and the second region, first channel patterns and first source/drain patterns on the first active region, second channel patterns and second source/drain patterns on the second active region, gate electrodes on the first and second channel patterns, the gate electrodes extending in a first direction and parallel to each other, and active contacts electrically connected to the first and second source/drain patterns, respectively. Each of the first and second channel patterns may include a plurality of semiconductor patterns vertically stacked to be spaced apart from each other. The active contacts may include first active contacts on the first region, second active contacts on the second region, and third active contacts on the third region. At least one of the first active contacts may have a fourth width in the first direction, at least one of the second active contacts may have a fifth width smaller than the fourth width, and at least one of the third active contacts may have a sixth width smaller than the fifth width.

According to some example embodiments of the inventive concepts, a semiconductor device may include a substrate including an active region, a device isolation layer defining the active region, source/drain patterns on the active region, channel patterns on the active region and connected to the source/drain patterns, each of the channel patterns including a plurality of semiconductor patterns vertically stacked to be spaced apart from each other, gate electrodes, which are respectively on the channel patterns and are extended in a first direction and parallel to each other, a gate insulating layer interposed between each of the gate electrodes and each of the channel patterns, a gate spacer on a side surface of each of the gate electrodes, a gate capping pattern on a top surface of each of the gate electrodes, an interlayer insulating layer on the gate capping pattern, active contacts penetrate the interlayer insulating layer and are electrically and respectively connected to the source/drain patterns, a metal-semiconductor compound layer interposed between each of the active contacts and each of the source/drain patterns, gate contacts, which penetrate the interlayer insulating layer and the gate capping pattern and are electrically and respectively connected to the gate electrodes, a first metal layer on the interlayer insulating layer, the first metal layer including first interconnection lines electrically and respectively connected to the active contacts and the gate contacts, and a second metal layer on the first metal layer. The second metal layer may include second interconnection lines electrically connected to the first metal layer, and the active region may include a first region having a first width, a second region having a second width, and a third region having a third width. The first width may be larger than the third width, and the third width may be larger than the second width. The third region may be interposed between the first region and the second region, and the source/drain patterns may include a first source/drain pattern, a second source/drain pattern, and a third source/drain pattern on the first to third regions, respectively. The active contacts may include a first active contact, a second active contact, and a third active contact electrically and respectively connected to the first to third source/drain patterns. A contact area between the first active contact and the first source/drain pattern may be larger than a contact area between the second active contact and the second source/drain pattern, and the contact area between the second active contact and the second source/drain pattern may be larger than a contact area between the third active contact and the third source/drain pattern.

BRIEF DESCRIPTION OF THE DRAWINGS

The drawings described herein are for illustrative purposes only of selected embodiments and not all possible implementations, and are not intended to limit the scope of the present disclosure.

FIGS. 2A to 2F are sectional views taken along lines A-A', B-B', C-C', D-D', E-E', and F-F, respectively, of FIG. 1.

DETAILED DESCRIPTION

Example embodiments of the inventive concepts will now be described more fully with reference to the accompanying drawings, in which example embodiments are shown.

Figure 1:
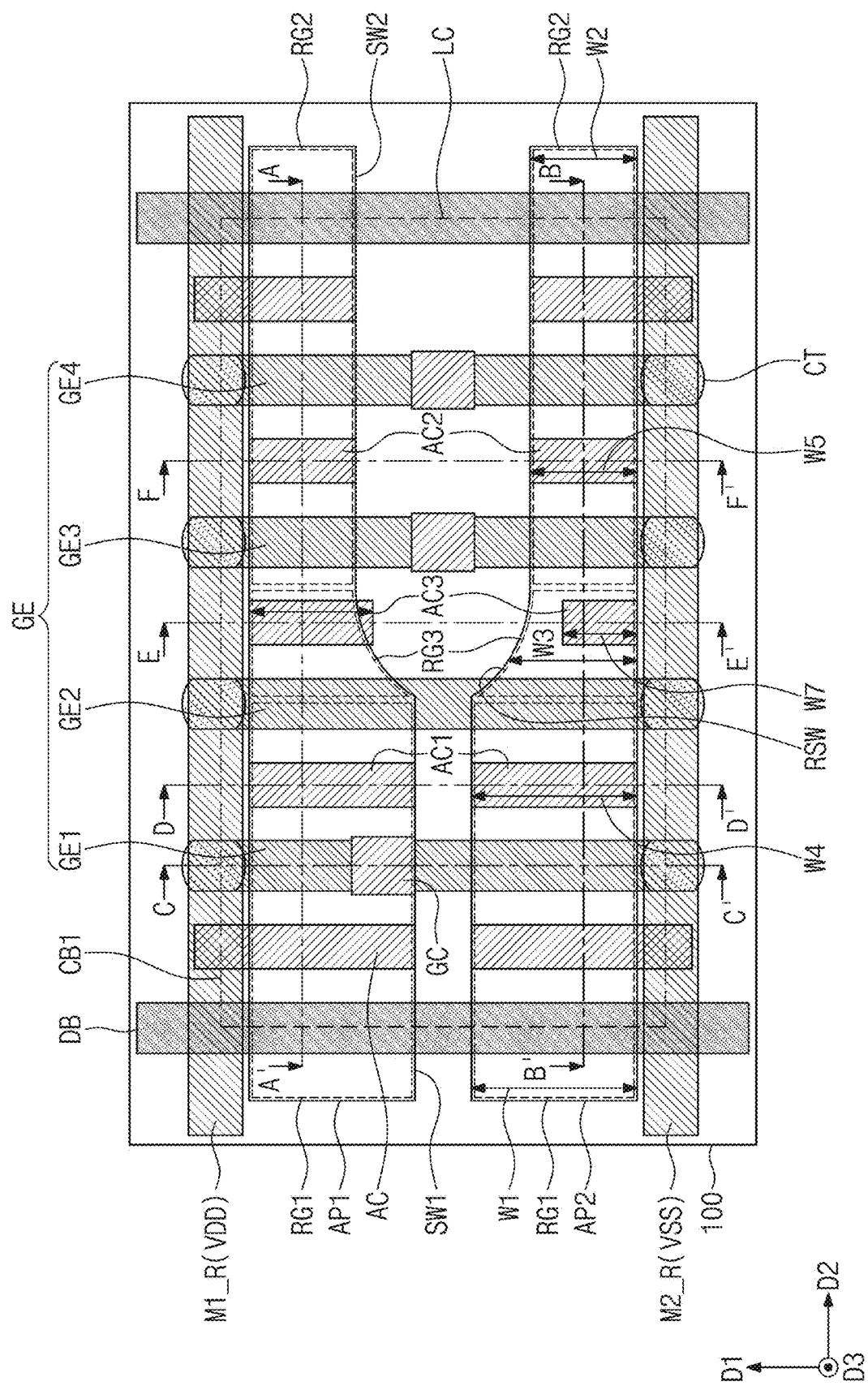
FIG. 1 is a plan view illustrating a semiconductor device according to some example embodiments of the inventive concepts.

FIG. 1 is a plan view illustrating a semiconductor device according to some example embodiments of the inventive concepts. FIGS. 2A to 2F are sectional views taken along lines A-A', B-B', C-C', D-D', E-E', and F-F, respectively, of FIG. 1.

Referring to FIGS. 1 and 2A to 2D, a logic cell LC may be provided on a substrate 100. Logic transistors constituting a logic circuit may be disposed on the logic cell LC. The substrate 100 may be a semiconductor substrate that is formed of or includes silicon, germanium, silicon germanium, a compound semiconductor material, or the like. In some example embodiments, the substrate 100 may be a silicon wafer.

The logic cell LC may include a first active region AP1 and a second active region AP2. The first and second active regions AP1 and AP2 may be defined by a trench TR, which is formed in an upper portion of the substrate 100. In other words, the trench TR may be located between the first and second active regions AP1 and AP2. The first and second active regions AP1 and AP2 may be spaced apart from each other in a first direction D1 with the trench TR interposed therebetween.

Each of the first and second active regions AP1 and AP2 may be a vertically-protruding upper portion of the substrate 100. The first and second active regions AP1 and AP2 may be extended in a second direction D2 to be parallel to each other.

A device isolation layer ST may be provided to fill the trench TR. The device isolation layer ST may cover side surfaces of the first and second active regions AP1 and AP2. In some example embodiments, the device isolation layer ST may include a silicon oxide layer.

A plurality of first channel patterns CH1 and a plurality of first source/drain patterns SD1 may be provided on the first active region AP1. The first channel patterns CH1 and the first source/drain patterns SD1 may be alternately arranged in the second direction D2. A plurality of second channel patterns CH2 and a plurality of second source/drain patterns SD2 may be provided on the second active region AP2. The second channel patterns CH2 and the second source/drain patterns SD2 may be alternately arranged in the second direction D2.

Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3). Each of the first to third semiconductor patterns SP1, SP2, and SP3 may be formed of or include at least one of silicon (Si), germanium (Ge), or silicon germanium (SiGe). In some example embodiments, each of the first to third semiconductor patterns SP1, SP2, and SP3 may be formed of or include silicon (Si).

The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3. Each of the first source/drain patterns SD1 may be provided in a first recess RS1 between the pair of first channel patterns CH1.

The second source/drain patterns SD2 may be impurity regions of a second conductivity type (e.g., n-type). The second channel pattern CH2 may be interposed between a pair of the second source/drain patterns SD2. In other words, each pair of the second source/drain patterns SD2 may be connected to each other by the stacked first to third semiconductor patterns SP1, SP2, and SP3. Each of the second source/drain patterns SD2 may be provided in a second recess RS2 between the pair of second channel patterns CH2.

The first and second source/drain patterns SD1 and SD2 may be epitaxial patterns, which are formed by a selective epitaxial growth process. In some example embodiments, a top surface of each of the first source/drain patterns SD1 may be higher than a top surface of the third semiconductor pattern SP3. A top surface of each of the second source/drain patterns SD2 may be located at substantially the same level as the top surface of the third semiconductor pattern SP3. In other example embodiments, the top surface of each of the second source/drain patterns SD2 may be higher than the top surface of the third semiconductor pattern SP3.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Gate electrodes GE may be provided to cross the first and second active regions AP1 and AP2 and to extend in the first direction D1. The gate electrodes GE may be arranged at a first pitch in the second direction D2. Each of the gate electrodes GE may be vertically overlapped with the first and second channel patterns CH1 and CH2. The gate electrodes GE may include first to fourth gate electrodes GE1-GE4, which are sequentially arranged in the second direction D2.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the gate electrode GE on the first active region AP1 may have different widths from each other. For example, the largest width of the first portion PO1 in the second direction D2 may be larger than the largest width of the second portion PO2 in the second direction D2. The largest width of the first portion PO1 in the second direction D2 may be larger than the largest width of the third portion PO3 in the second direction D2. The largest width of the second portion PO2 in the second direction D2 may be larger or smaller than the largest width of the third portion PO3 in the second direction D2.

Referring back to FIG. 2C, the gate electrode GE may be provided on a top surface TS, a bottom surface BS, and opposite side surfaces SS of each of the first to third semiconductor patterns SP1, SP2, and SP3. That is, the transistor in the logic cell LC according to the present example embodiment may be a three-dimensional field effect transistor (e.g., multi-bridge channel field effect transistor (MBCFET) or gate-all-around FET (GAAFET)) in which the gate electrode GE is provided to three-dimensionally surround the channel pattern.

Referring back to FIGS. 1 and 2A to 2D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In some example embodiments, the gate spacers GS may be a multi-layered structure, which includes at least two different materials selected from SiCN, SiCON, and SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SS of each of the first to third semiconductor patterns SP1, SP2, and SP3. The gate insulating layer GI may cover a top surface of the device isolation layer ST, which is located below the gate electrode GE (e.g., see FIG. 2C).

Although not shown, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In some example embodiments, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

In some example embodiments, the gate insulating layer GI may include a silicon oxide layer, a silicon oxynitride layer, and/or a high-k dielectric layer. For example, the gate insulating layer GI may have a structure, in which a silicon oxide layer and a high-k dielectric layer are stacked. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In other example embodiments, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In some example embodiments, the ferroelectric layer may have a thickness ranging from 0.5 to 10 nm, but the inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIG. 2B, inner spacers ISP may be provided on an NMOSFET region. The inner spacers ISP may be respectively interposed between the second source/drain pattern SD2 and the first to third portions PO1, PO2, and PO3 of the gate electrode GE. The inner spacers ISP may be in direct contact with the second source/drain pattern SD2. Each of the first to third portions PO1, PO2, and PO3 of the gate electrode GE may be spaced apart from the second source/drain pattern SD2 by the inner spacer ISP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In some example embodiments, at least one of the first and second interlayer insulating layers 110 and 120 may include a silicon oxide layer.

A first cell border CB1 extending in the second direction D2 may be defined in the logic cell LC. A second cell border CB2 may be defined in a region of the logic cell LC opposite to the first cell border CB1. Gate cutting patterns CT may be disposed on the first and second borders CB1 and CB2. When viewed in a plan view, the gate cutting patterns CT may be disposed to be overlapped with the gate electrodes GE, respectively.

The gate cutting pattern CT may be provided to penetrate the gate electrode GE. The gate cutting pattern CT may be extended from the device isolation layer ST to the gate capping pattern GP in the third direction D3. The gate cutting pattern CT may be formed of or include at least one of insulating materials (e.g., silicon nitride, silicon oxide, or combinations thereof). The gate electrode GE of the logic cell LC may be separated from a gate electrode of a neighboring logic cell by the gate cutting pattern CT.

A pair of division structures DB, which are opposite to each other in the second direction D2, may be provided at both sides of the logic cell LC. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active regions AP1 and AP2. The division structure DB may be provided to penetrate an upper portion of each of the first and second active regions AP1 and AP2. The division structure DB may separate the first and second active regions AP1 and AP2 of the logic cell LC from the active region of a neighboring logic cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may be provided to cover a portion of the top surface of the gate capping pattern GP.

Metal-semiconductor compound layers SC may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. The metal-semiconductor compound layer SC may be formed of or include at least one of metal silicides (e.g., titanium silicide, tantalum silicide, tungsten silicide, nickel silicide, and cobalt silicide).

Figure 2A:
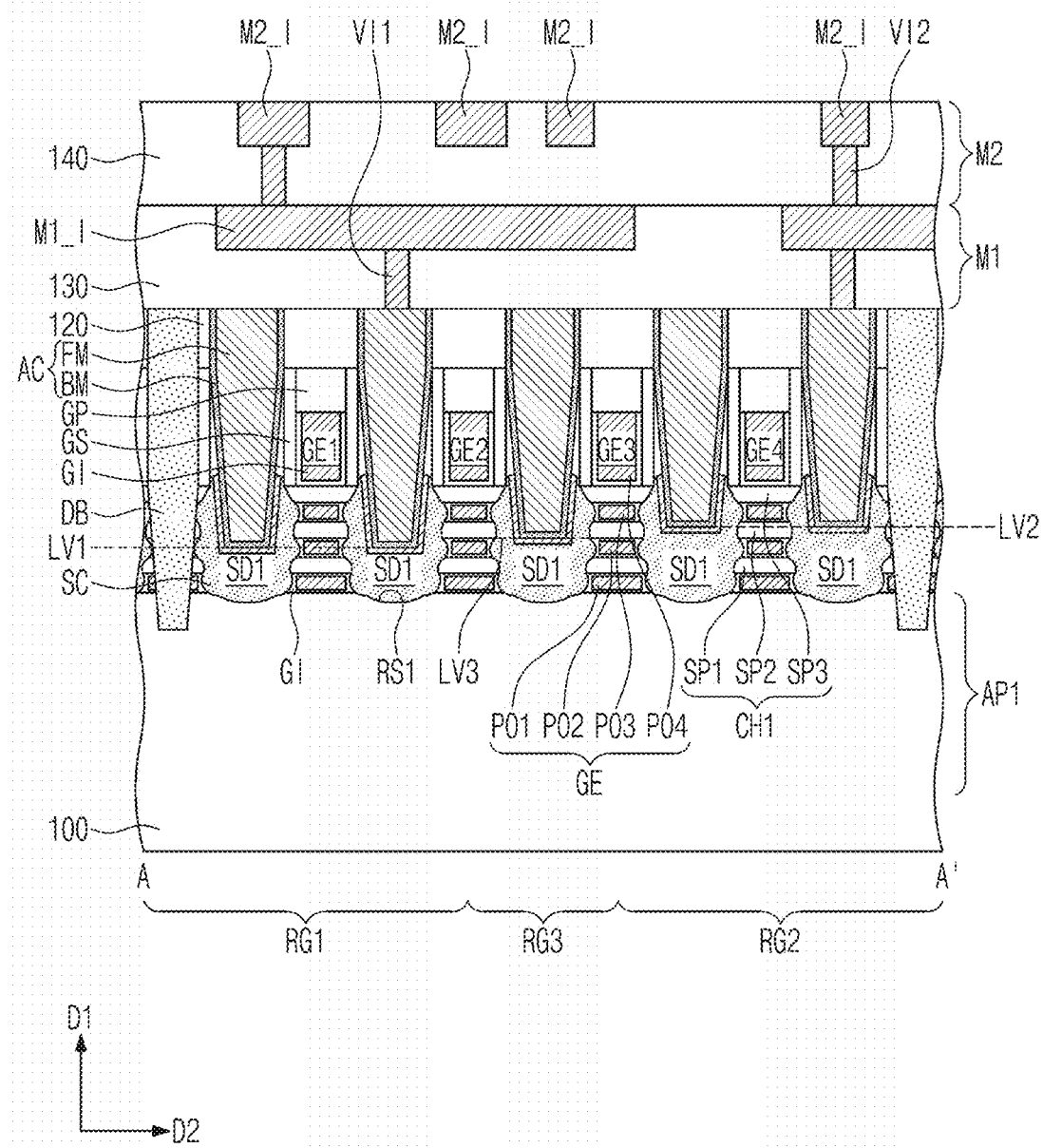
Figure 2B:
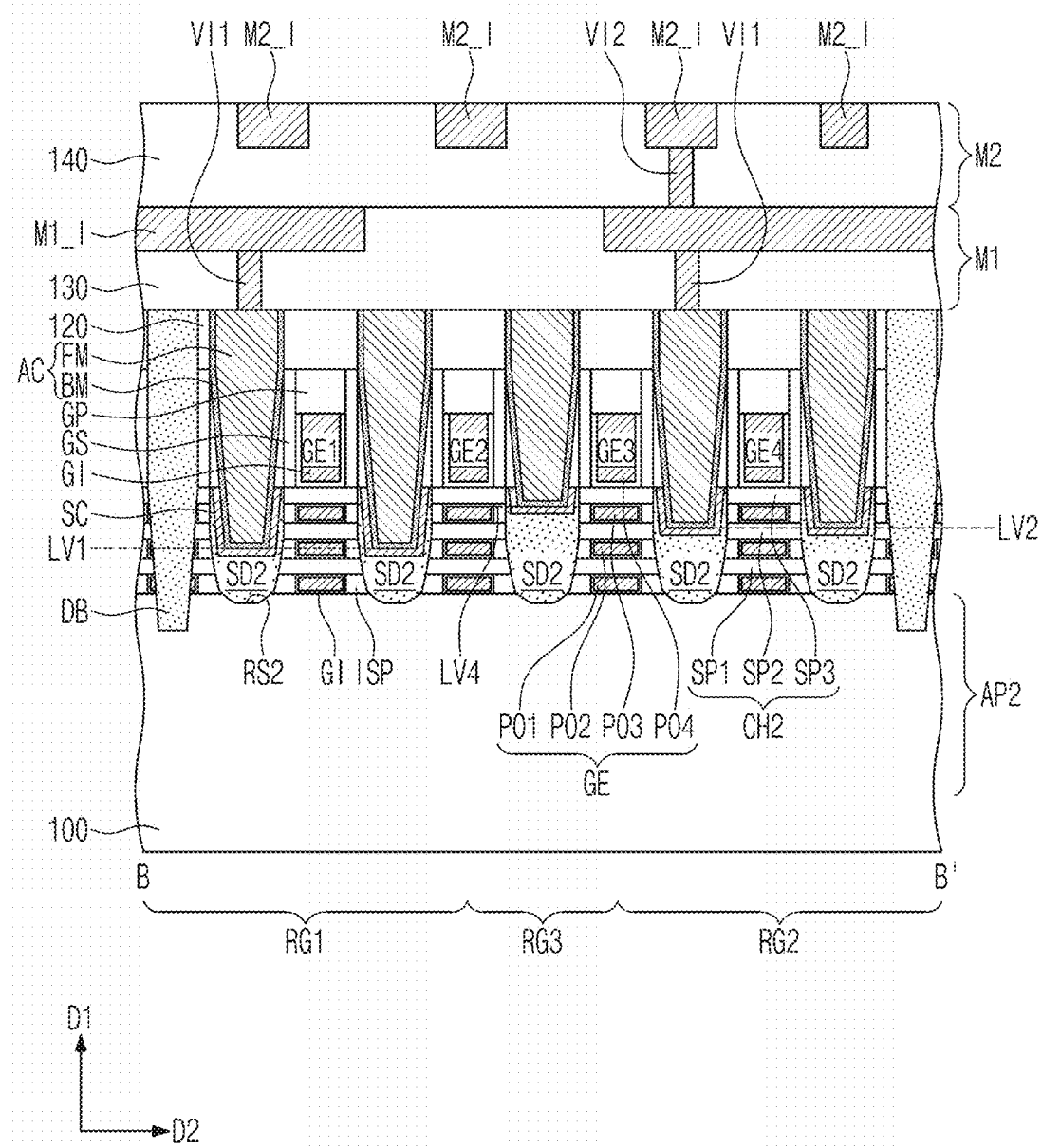
Figure 2C:
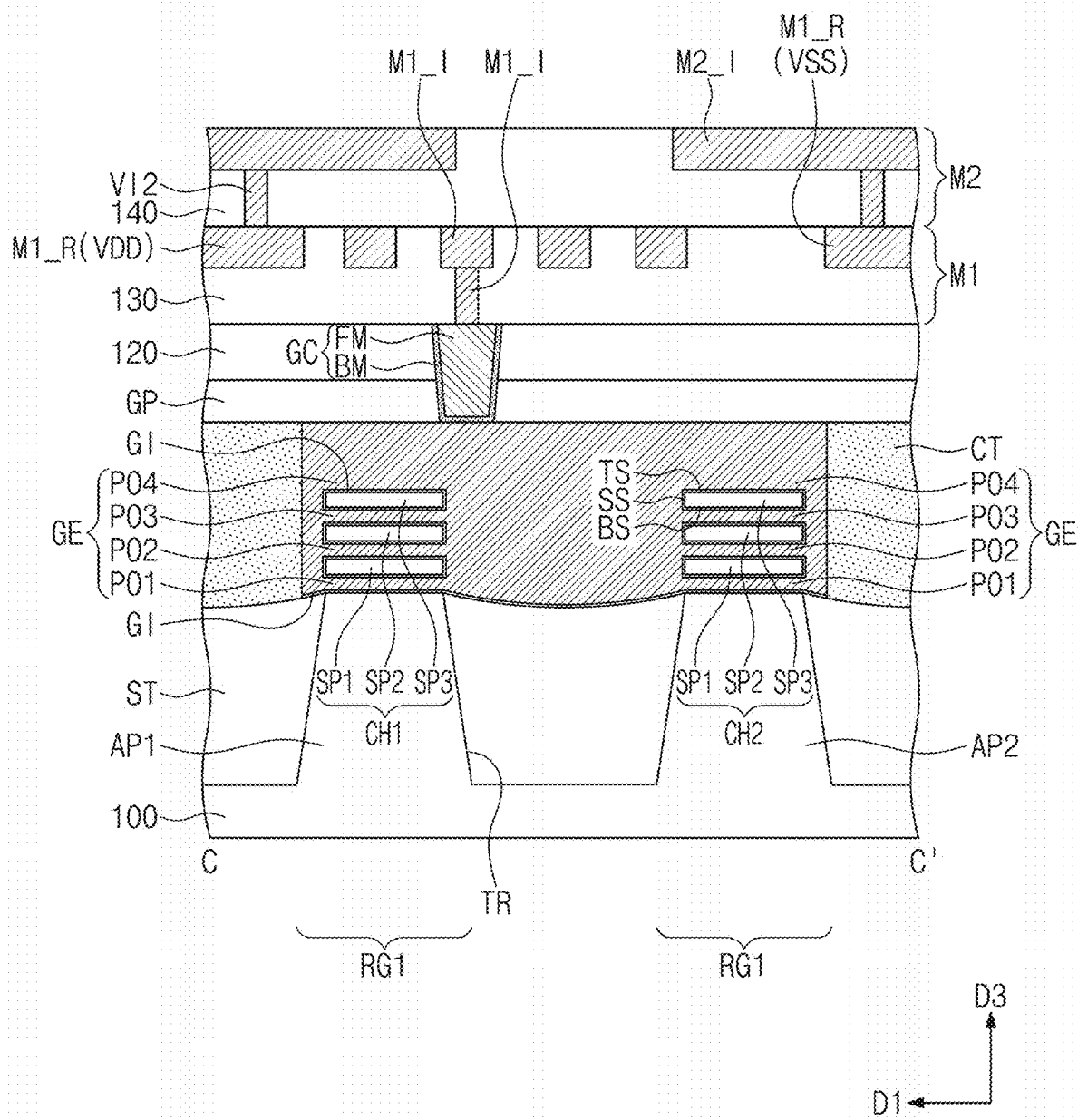
Figure 2D:
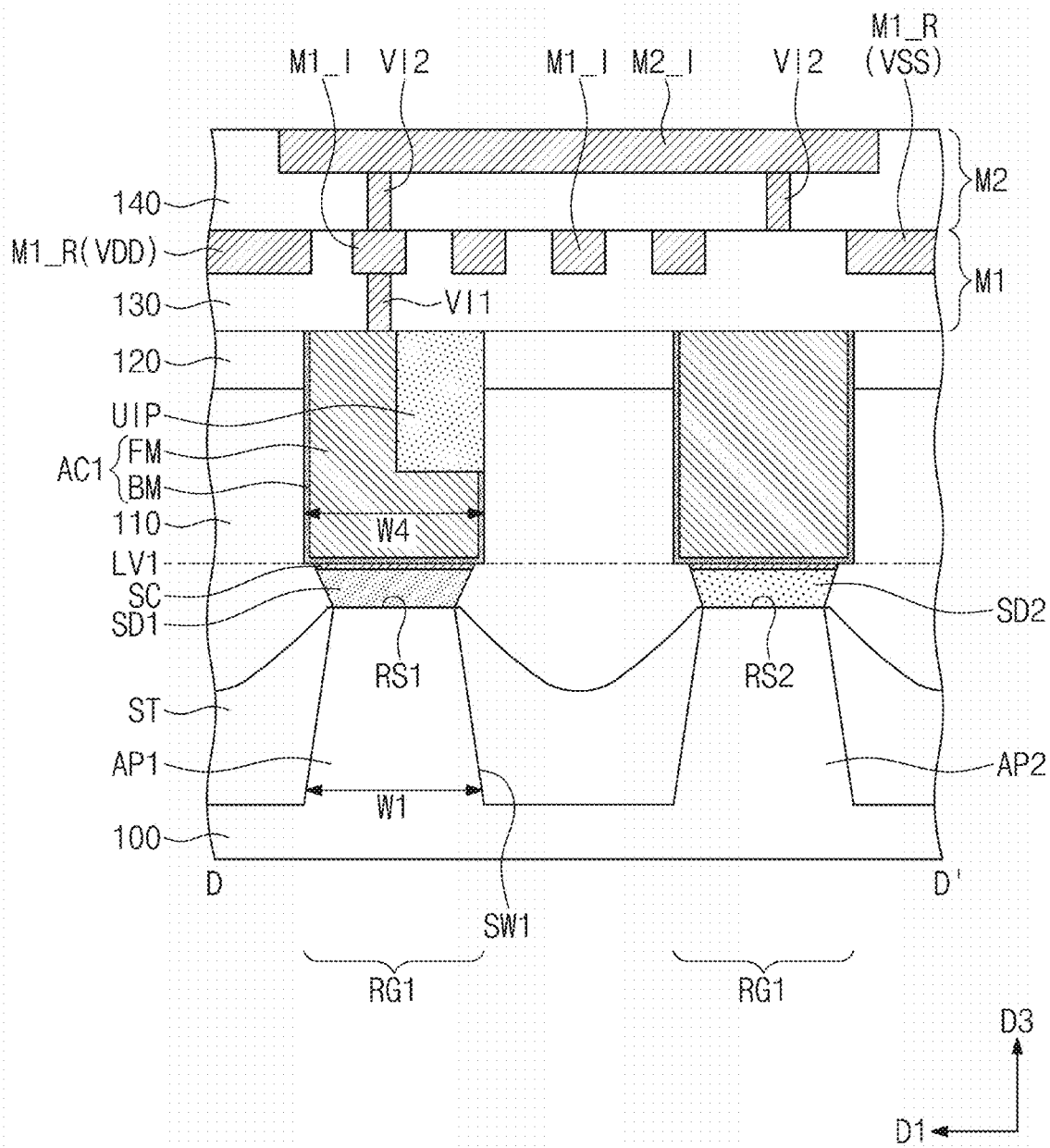

A gate contact GC may be provided to penetrate the second interlayer insulating layer 120 and the gate capping pattern GP and to be electrically connected to the gate electrode GE. Referring to FIG. 2D, a region which is located on each active contact AC near the gate contact GC, may be filled with an upper insulating pattern UIP. Accordingly, it may be possible to prevent or mitigate against a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In some example embodiments, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include a first power line M1_R1, a second power line M1_R2, and lower interconnection lines M1_I.

Each of the first and second power lines M1_R1 and M1_R2 may be extended in the second direction D2 to cross the logic cell LC. In detail, the first power line M1_R1 may be disposed on the first cell border CB1 of the logic cell LC. The first power line M1_R1 may be extended along the first cell border CB1 and in the second direction D2. The second power line M1_R2 may be disposed on the second cell border CB2 of the logic cell LC. The second power line M1_R2 may be extended along the second cell border CB2 and in the second direction D2.

The lower interconnection lines M1_I may be disposed between the first and second power lines M1_R1 and M1_R2. The lower interconnection lines M1_I may be line- or bar-shaped patterns extending in the second direction D2. The lower interconnection lines M1_I may be arranged with a second pitch in the first direction D1. In some example embodiments, the second pitch may be smaller than the first pitch.

The first metal layer M1 may further include lower vias VI1. The lower vias VI1 may be provided below the interconnection lines M1_R1, M1_R2, and M1_I of the first metal layer M1. The lower vias VI1 may be respectively interposed between the active contacts AC and the interconnection lines M1_R1, M1_R2, and M1_I of the first metal layer M1. In addition, the lower vias VI1 may be respectively interposed between the gate contacts GC and the interconnection lines M1_R1, M1_R2, and M1_I of the first metal layer M1.

The interconnection line M1_R1, M1_R2, or M1_I of the first metal layer M1 and the lower via VI1 thereunder may be formed by separate processes. In other words, each of the interconnection line M1_R1, M1_R2, or M1_I and the lower via VI1 may be formed by a single damascene process. The semiconductor device according to the present example embodiments may be fabricated using a sub-20 nm process.

A second metal layer M2 may be provided in a fourth interlayer insulating layer 140. The second metal layer M2 may include upper interconnection lines M2_I. Each of the upper interconnection lines M2_I of the second metal layer M2 may be a line- or bar-shaped pattern extending in the first direction D1. In other words, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch in the second direction D2. The third pitch may be smaller than the first pitch. The third pitch may be greater than the second pitch.

The second metal layer M2 may further include upper vias VI2. The upper vias VI2 may be provided below the upper interconnection lines M2_I. The upper vias VI2 may be respectively interposed between the upper interconnection lines M2_I and the interconnection lines M1_R1, M1_R2, and M1_I of the first metal layer M1.

The upper interconnection line M2_I of the second metal layer M2 and the upper via VI2 thereunder may be formed by the same process and may form a single object. For example, the upper interconnection line M2_I and the upper via VI2 of the second metal layer M2 may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, molybdenum, and cobalt). Although not shown, a plurality of stacked metal layers (e.g., M3, M4, M5, and so forth) may be further disposed on the fourth interlayer insulating layer 140. Each of the stacked metal layers may include routing lines.

Referring to FIGS. 1 and 2D to 2F, the first active region AP1 may have a width in the first direction D1. The first active region AP1 may include a first region RG1 having a first width W1, a second region RG2 having a second width W2, and a third region RG3 having a third width W3.

The first width W1 may be larger than the second width W2. In other words, the first region RG1 may be an active region having a relatively large width, and the second region RG2 may be an active region having a relatively small width. The third region RG3 may be interposed between the first region RG1 and the second region RG2. The third region RG3 may be an intermediate region whose width W3 varies from the first width W1 to the second width W2. For example, the third width W3 of the third region RG3 may be gradually decreased in a direction from the first region RG1 to the second region RG2. The third width W3 may be larger than the second width W2 and may be smaller than the first width W1. When viewed in a plan view, the third region RG3 may have a tapered shape.

The third region RG3 may have a rounded side surface RSW (e.g., see FIG. 1). The rounded side surface RSW may connect a first side surface SW1 of the first region RG1 to a second side surface SW2 of the second region RG2.

Referring to FIGS. 2D and 2F, a size of the first source/drain pattern SD1 on the first region RG1 may be larger than a size of the first source/drain pattern SD1 on the second region RG2. In detail, a width of the first source/drain pattern SD1 on the first region RG1 may be larger than a width of the first source/drain pattern SD1 on the second region RG2, when measured in the first direction D1. This is because the first width W1 of the first region RG1 is larger than the second width W2 of the second region RG2. The size or the largest width of the source/drain pattern may be proportional to a width of the active region.

Figure 2E:
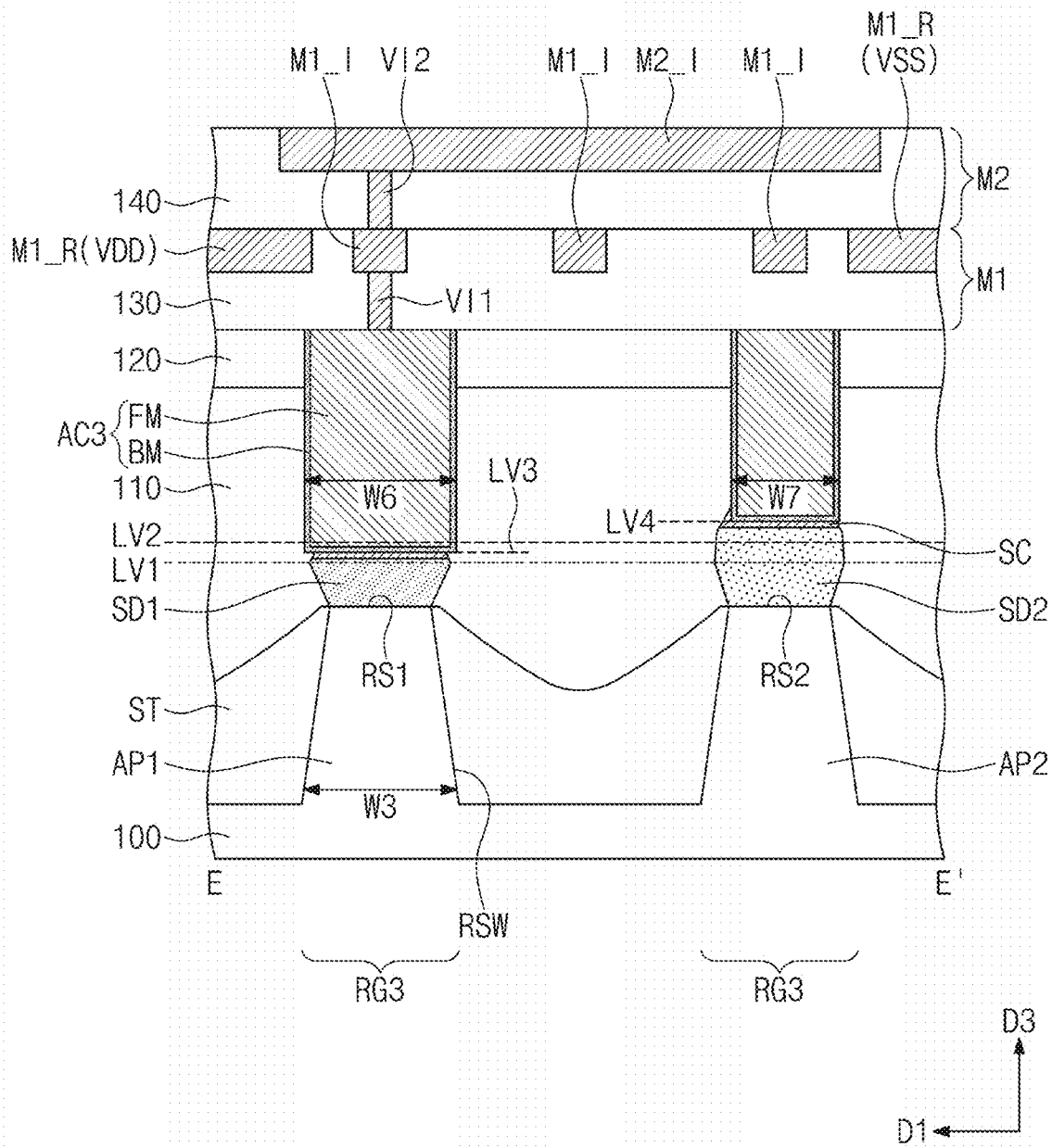

Referring to FIGS. 2D, 2E, and 2F, a size of the first source/drain pattern SD1 on the third region RG3 may be larger than a size of the first source/drain pattern SD1 on the second region RG2. A size of the first source/drain pattern SD1 on the third region RG3 may be smaller than a size of the first source/drain pattern SD1 on the first region RG1. In detail, the width of the first source/drain pattern SD1 on the third region RG3 may be larger than the width of the first source/drain pattern SD1 on the second region RG2 and may be smaller than the width of the first source/drain pattern SD1 on the first region RG1.

Similar to the first active region AP1, the second active region AP2 may also include first to third regions RG1-RG3. The first to third regions RG1-RG3 of the second active region AP2 may be substantially the same as the first to third regions RG1-RG3 of the first active region AP1 described above.

The first gate electrode GE1 may be provided on the first region RG1. The second gate electrode GE2 may be provided on a boundary between the first region RG1 and the third region RG3. The third gate electrode GE3 may be provided on a boundary between the second region RG2 and the third region RG3. The fourth gate electrode GE4 may be provided on the second region RG2.

A transistor, in which the first gate electrode GE1 is used as a gate electrode, may have uniform electric characteristics, because both of the source and drain patterns thereof are located on the first region RG1. A transistor, in which the fourth gate electrode GE4 is used as a gate electrode, may have uniform electric characteristics, because both of the source and drain patterns thereof are located on the second region RG2.

In some example embodiments, the second gate electrode GE2 may be a dummy electrode. In detail, the gate contact GC on the second gate electrode GE2 may be omitted. In some example embodiments, the division structure DB may be formed on the second gate electrode GE2. In still other example embodiments, the second gate electrode GE2 may be used as an active electrode.

The first and second source/drain patterns SD1 and SD2 on the third region RG3 may have a size larger than the first and second source/drain patterns SD1 and SD2 on the second region RG2. Thus, an electric resistance of the first and second source/drain patterns SD1 and SD2 on the third region RG3 may be lower than an electric resistance of the first and second source/drain patterns SD1 and SD2 on the second region RG2.

For a transistor, in which the third gate electrode GE3 is used as a gate electrode, one of the source and drain patterns thereof may be located on the second region RG2, but the other of the drain and source patterns may be located on the third region RG3. Due to a difference in size between the source and drain patterns, such a transistor may have non-uniform electric characteristics. However, according to some example embodiments of the inventive concepts, as will be described below, by adjusting a size and position of a third active contact AC3, it may be possible to realize uniform electric characteristics of the transistor with the third gate electrode GE3.

In the case where the first active region AP1 is a PMOS-FET region, the first source/drain pattern SD1 may include silicon-germanium (SiGe) causing a compressive stress. If a size of the first source/drain pattern SD1 is increased, a stress applied to the first channel pattern CH1 may be increased, and this may lead to a reduction of a threshold voltage of a transistor. For example, a PFET device with the third gate electrode GE3 may have a threshold voltage that is lower than a designed value, due to the relatively-large first source/drain pattern SD1 on the third region RG3.

The active contacts AC may include a first active contact AC1 on the first region RG1, a second active contact AC2 on the second region RG2, and the third active contact AC3 on the third region RG3. First, the first to third active contacts AC1-AC3 on the first active region AP1 will be described in more detail.

The first active contact AC1 may have a fourth width W4, which corresponds to the first width W1 of the first region RG1, in the first direction D1. The second active contact AC2 may have a fifth width W5, which corresponds to the second width W2 of the second region RG2, in the first direction D1. The fourth width W4 may be larger than the fifth width W5. The third active contact AC3 may have a sixth width W6 larger than the fifth width W5. The sixth width W6 may be smaller than the fourth width W4.

The larger the width of the active contact AC, the larger the depth of the active contact AC. In other words, as the width of the active contact AC increases, the level of the bottom surface of the active contact AC may be lowered. As the width of the active contact AC increases, a distance from the bottom surface of the active contact AC to the substrate 100 may be decreased.

Referring to FIGS. 2A, 2D, 2E, and 2F, a bottom surface of the first active contact AC1 may be located at a first level LV1, and a bottom surface of the second active contact AC2 may be located at a second level LV2. A bottom surface of the third active contact AC3 may be located at a third level LV3 lower than the second level LV2.

In the present example embodiments, since the third active contact AC3 has the width W6 larger than the width W5 of the second active contact AC2, an etching amount of the first source/drain pattern SD1 may be increased. In other words, by reducing a volume of the first source/drain pattern SD1 through the third active contact AC3, it may be possible to reduce a stress exerted on the channel pattern. As a result, it may be possible to prevent or mitigate against a PFET with the third gate electrode GE3 from having a threshold voltage lower than a designed value. The reduction of the volume of the first source/drain pattern SD1 on the third region RG3 may lead to an increase of an electric resistance of the first source/drain pattern SD1. Accordingly, it may be possible to prevent or mitigate against the first source/drain pattern SD1 of the third region RG3 from having an electric resistance lower than a designed value.

Next, the first to third active contacts AC1-AC3 on the second active region AP2 will be described in more detail. Referring to FIGS. 2A, 2D, 2E, and 2F, similar to the first and second active contacts AC1 and AC2 on the first active region AP1, the first active contact AC1 may have the fourth width W4, and the second active contact AC2 may have the fifth width W5. A bottom surface of the first active contact AC1 may be located at the first level LV1, and a bottom surface of the second active contact AC2 may be located at the second level LV2.

The third active contact AC3 may have a seventh width W7 smaller than the fifth width W5. Thus, a bottom surface of the third active contact AC3 may be located at a fourth level LV4 higher than the second level LV2.

The width W7 of the third active contact AC3 on the second active region AP2 may be smaller than the width W6 of the third active contact AC3 on the first active region AP1. A level LV4 of a bottom surface of the third active contact AC3 on the second active region AP2 may be higher than a level LV3 of a bottom surface of the third active contact AC3 on the first active region AP1 (e.g., see FIG. 2E).

According to some example embodiments, by reducing the width W7 of the third active contact AC3 to a value smaller than the width W5 of the second active contact AC2, it may be possible to raise the level LV4 of the bottom surface of the third active contact AC3. In this case, an electric resistance between the third active contact AC3 and the second source/drain pattern SD2 may be increased, because a contact area therebetween is reduced. Accordingly, it may be possible to prevent or mitigate against the second source/drain pattern SD2 of the third region RG3 from having an electric resistance lower than a designed value.

Figure 3A:
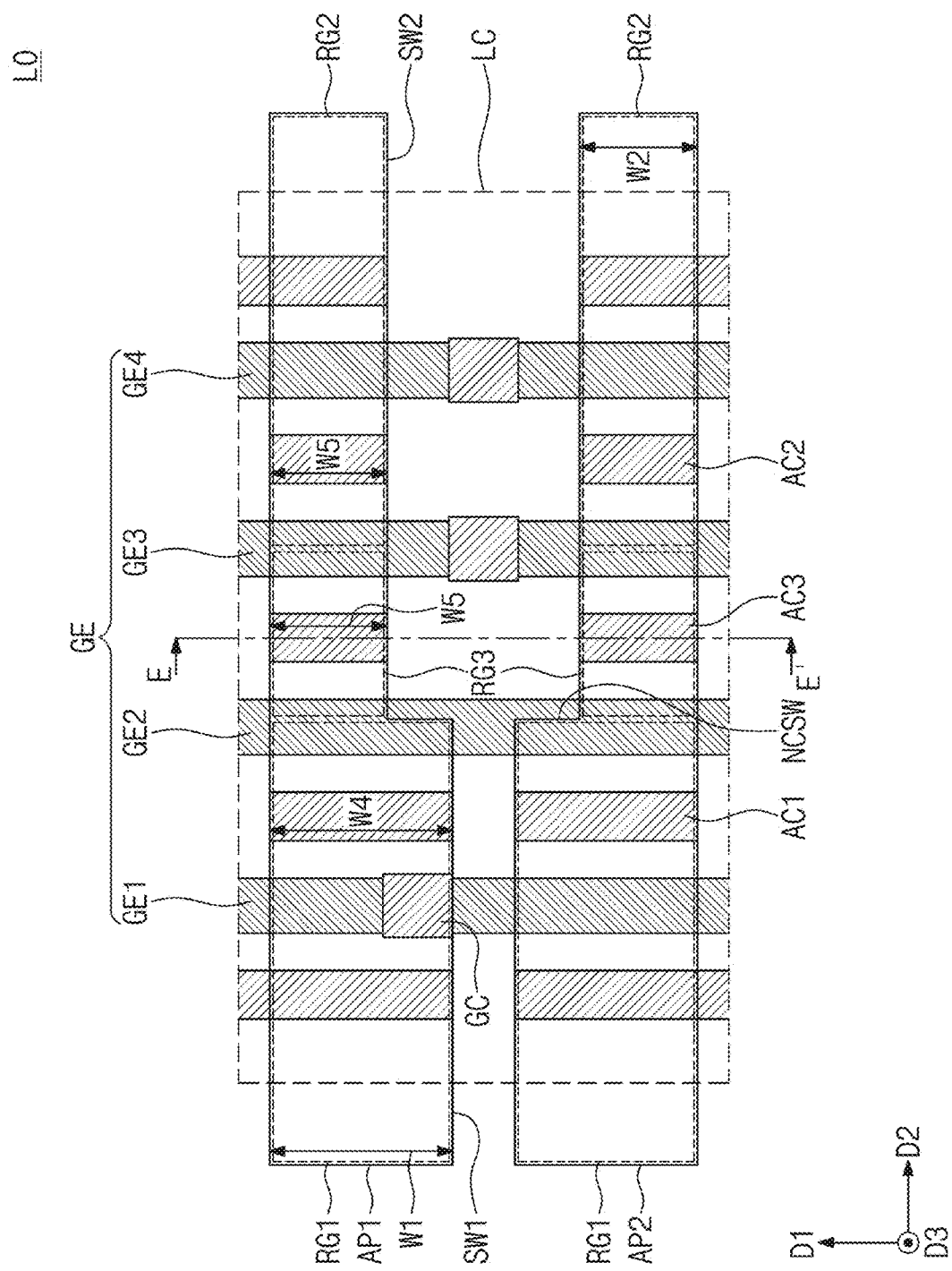
FIG. 3A is a plan view of a semiconductor device predicted through a simulation process on a layout.
Figure 3B:
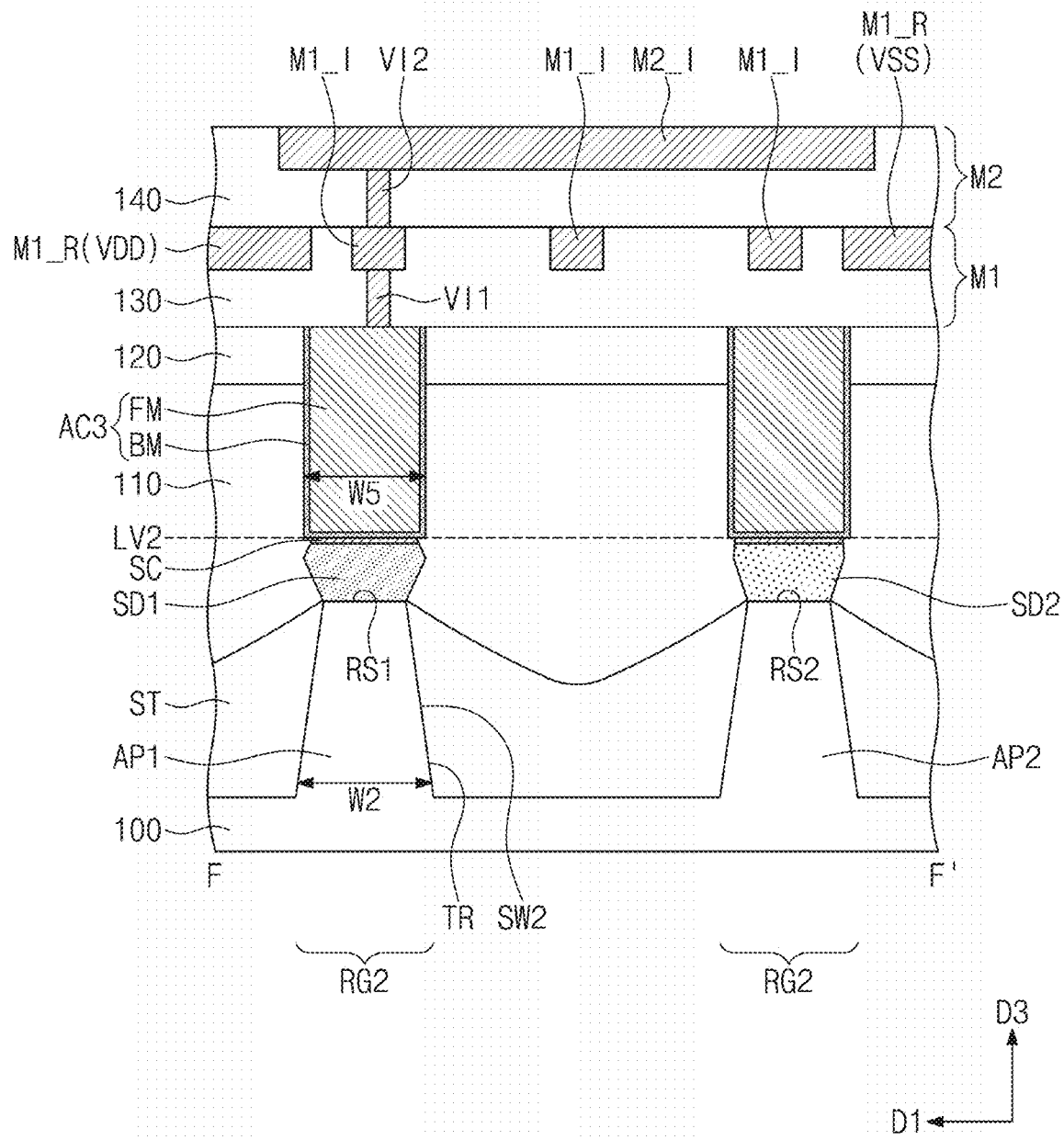
FIG. 3B is a sectional view of a semiconductor device, which is actually realized on a wafer (i.e., substrate) based on a design layout and is taken along a line E-E of FIG. 3A.

FIG. 3A is a plan view of a semiconductor device predicted through a simulation process on a layout. FIG. 3B is a sectional view of a semiconductor device, which is actually realized on a wafer (i.e., substrate) based on a design layout and is taken along a line E-E of FIG. 3A.

Referring to FIG. 3A, a layout LO of a semiconductor device according to some example embodiments may be designed as depicted by FIG. 3A. In detail, the third region RG3 of each of the first and second active regions AP1 and AP2 may be designed to have the same width W5 as the second width W2 of the second region RG2.

The width of the active region AP1 or AP2 may be discontinuously changed at a boundary between the first region RG1 and the third region RG3. For example, the first width W1 of the first region RG1 may be abruptly decreased to the second width W2 at a position out of the boundary. Thus, the active region AP1 or AP2 may have a side surface NCSW, which is parallel to the first direction D1, at the boundary between the first region RG1 and the third region RG3.

Since the third region RG3 is designed to have the second width W2, the third active contact AC3 on the third region RG3 may be determined to have the same width as the fifth width W5 of the second active contact AC2.

In a design simulation process, a planar structure of a semiconductor device, which will be realized on an actual wafer, may be predicted, based on the afore-described layout for the semiconductor device of FIG. 3A. Furthermore, in the design simulation process, electric characteristics of the semiconductor device may be predicted based on the plan view of FIG. 3A, and then, a process of designing the semiconductor device may be executed based on the predicted electric characteristics.

Even when a semiconductor device is fabricated based on the layout of FIG. 3A, due to practical issues, such as limitation in an exposure process, a shape of an active region AP1 or AP2, which is actually realized on the substrate 100 may be different from the shape of the active region AP1 or AP2 of FIG. 3A. In detail, as previously described with reference to FIG. 1, the actual active region AP1 or AP2 may include the third region RG3 having the rounded side surface RSW. A width of the actual active region AP1 or AP2 may be continuously or gradually decreased in the third region RG3. The third region RG3 may have a tapered shape.

Referring to FIG. 3B, unlike the design of FIG. 3A, the first and second active regions AP1 and AP2 may be formed to have the third width W3, as shown in FIG. 2E. Accordingly, the sizes of the first and second source/drain patterns SD1 and SD2 may also be increased, compared with their design values.

However, since the third active contact AC3 is formed to have the fifth width W5, a bottom surface of the third active contact AC3 may be located at the second level LV2. Since the source/drain pattern SD1 or SD2 has a size larger than a designed size, an electric resistance between the third active contact AC3 and the source/drain pattern SD1 or SD2 may be reduced to a value smaller than a predicted value.

As a result, the semiconductor device of FIGS. 3A and 3B (e.g., a transistor, in which the third gate electrode GE3 is used as a gate electrode) may have electric characteristics that are different from those predicted by the simulation process. This may increase a difference in electric characteristics between an actual semiconductor device and a predicted semiconductor device. In other words, this may lead to deterioration in a model-hardware correlation (MHC) property. The deterioration of the MHC property may result in an increase of malfunction of the semiconductor device and a reliability issue of the semiconductor device. Furthermore, the semiconductor device of FIGS. 3A and 3B may suffer from an increased leakage current, because the source/drain pattern SD1 or SD2 has a size larger than a designed size.

By contrast, according to some example embodiments of the inventive concepts, as previously described with reference to FIGS. 1 to 2F, the third active contact AC3 on the third region RG3 may be formed to have a width different from the width of the second active contact AC2. Accordingly, an actual semiconductor device may be fabricated to have the same electric characteristics as those predicted by a simulation process. That is, according to some example embodiments of the inventive concepts, it may be possible to prevent or reduce the MHC property from being deteriorated and thereby to reduce malfunction of the semiconductor device. Furthermore, it may be possible to prevent or mitigate against the leakage current from being increased.

Figure 4A:
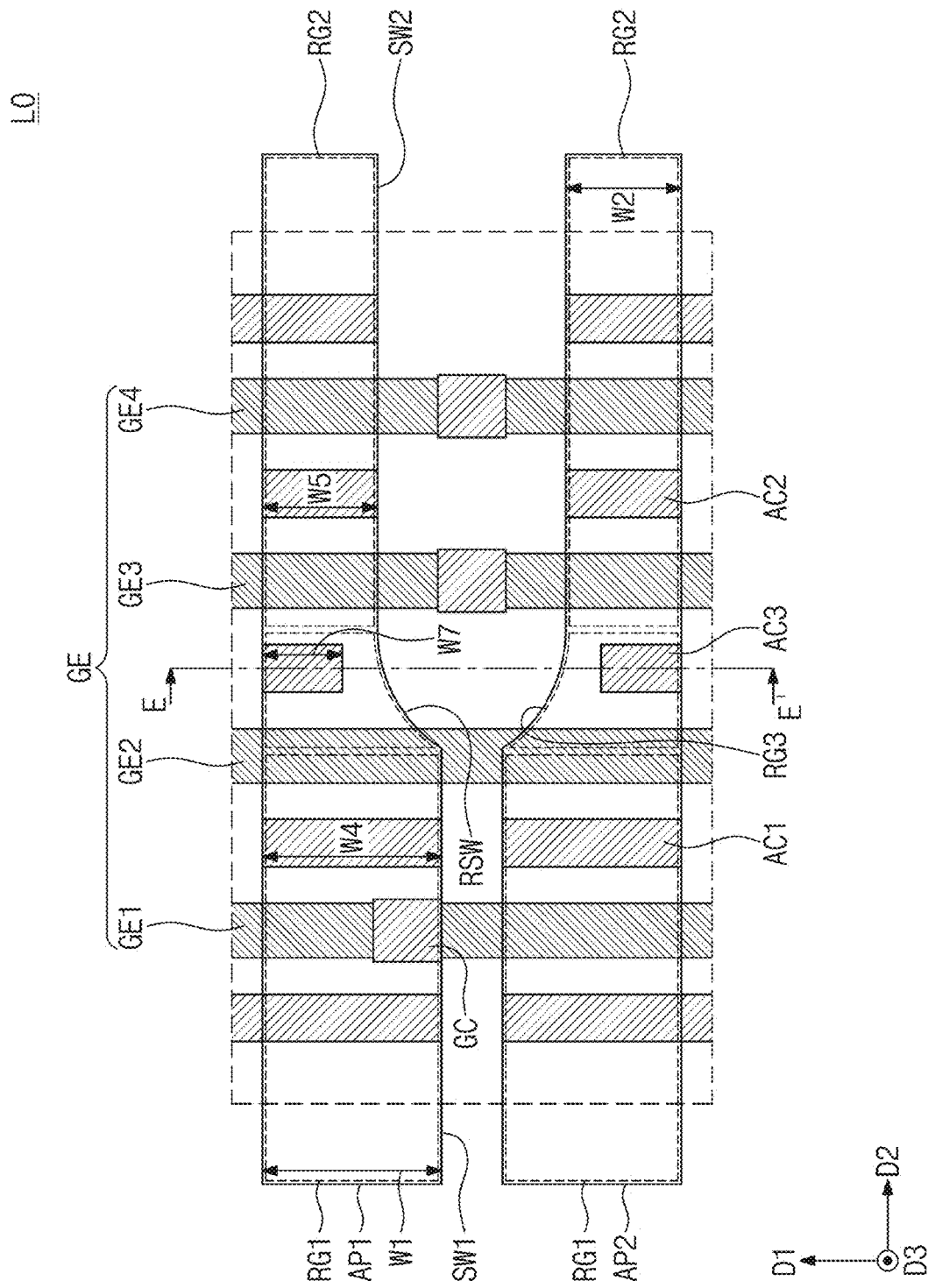
FIG. 4A is a plan view illustrating a semiconductor device according to some example embodiments of the inventive concepts.
Figure 4B:
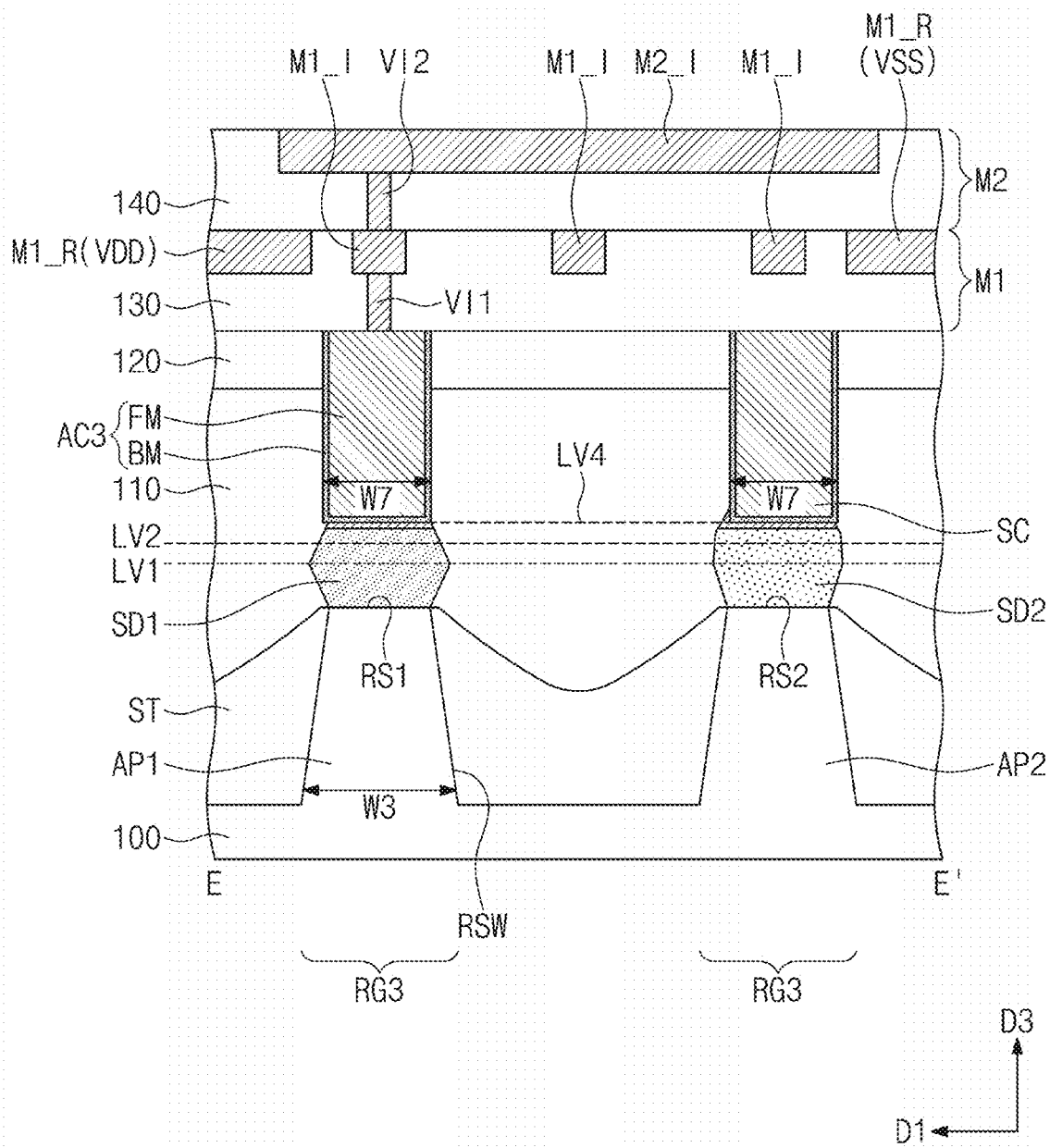
FIG. 4B is a sectional view taken along a line E-E' of FIG. 4A.
Figure 5A:
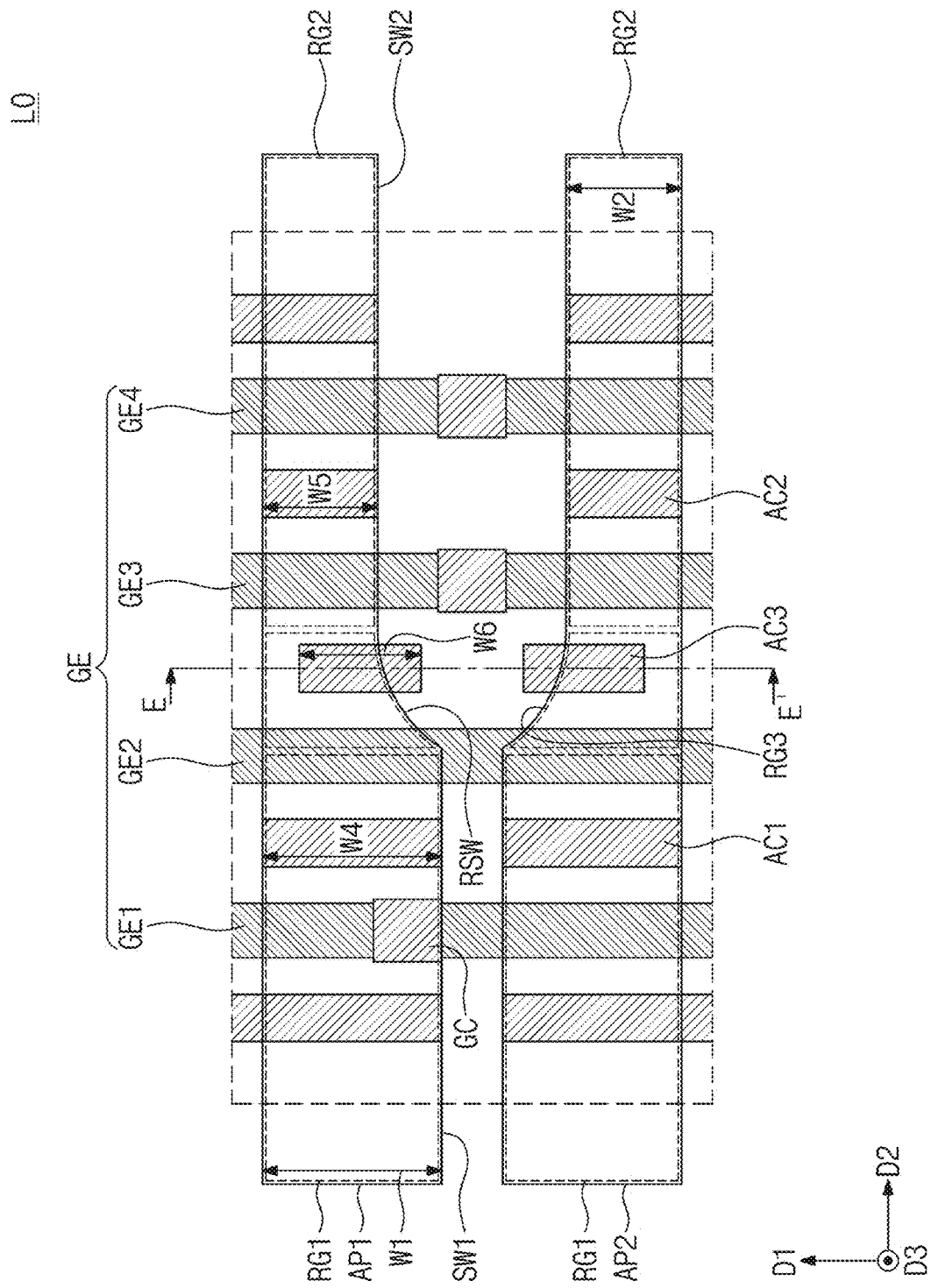
FIG. 5A is a plan view illustrating a semiconductor device according to some example embodiments of the inventive concepts.
Figure 5B:
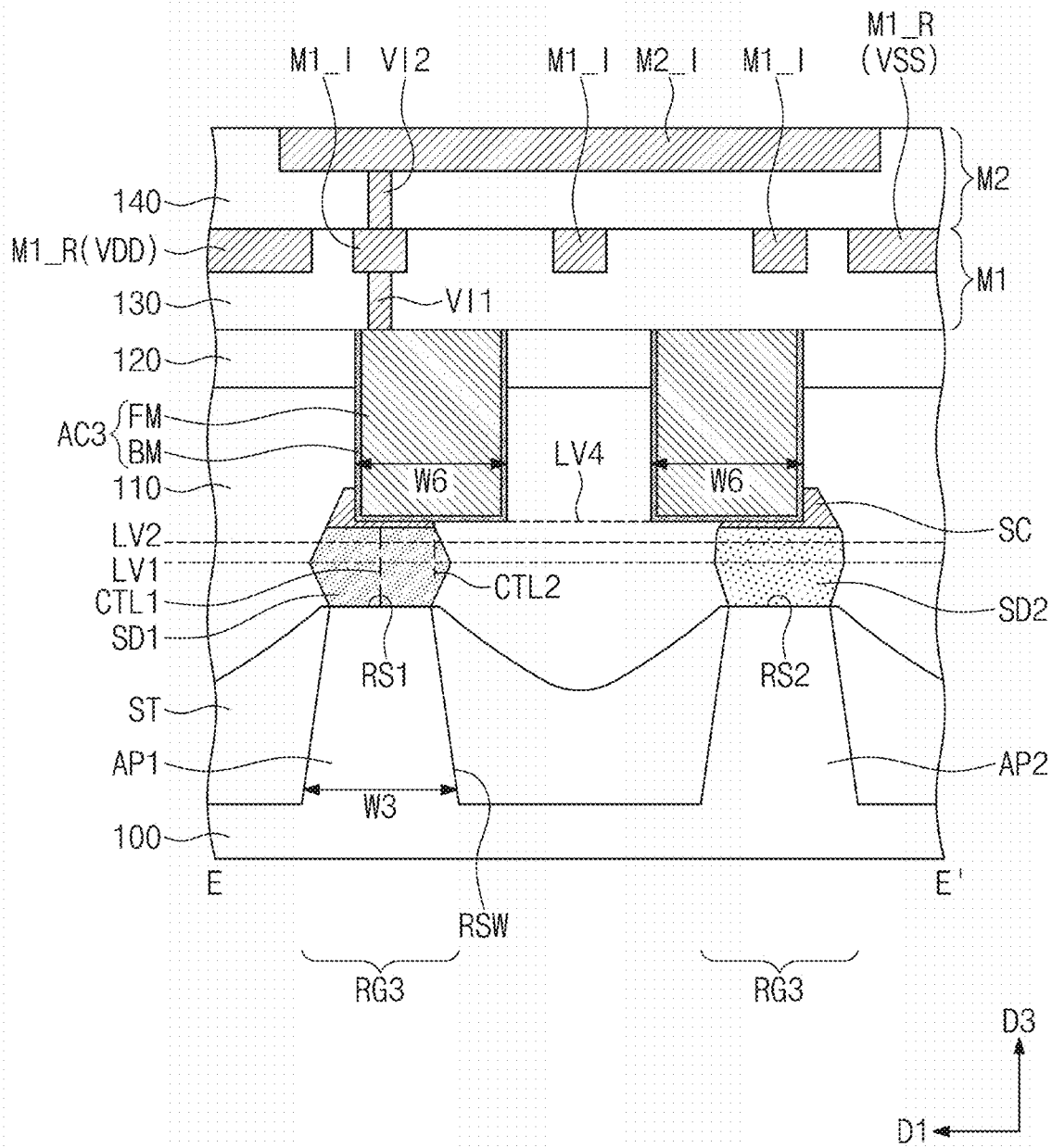
FIG. 5B is a sectional view taken along line a line E-E' of FIG. 5A.

FIG. 4A is a plan view illustrating a semiconductor device according to some example embodiments of the inventive concepts. FIG. 4B is a sectional view taken along a line E-E' of FIG. 4A. FIG. 5A is a plan view illustrating a semiconductor device according to some example embodiments of the inventive concepts. FIG. 5B is a sectional view taken along line a line E-E' of FIG. 5A. In the following description, an element previously described with reference to FIGS. 1 and 2A to 2F may be identified by the same reference number without repeating an overlapping description thereof, for the sake of brevity.

Referring to FIGS. 4A and 4B, the third active contact AC3 on the first active region AP1 may have the same width as the seventh width W7 of the third active contact AC3 on the second active region AP2. In other words, the width W7 of the third active contact AC3 on the first active region AP1 may be smaller than the width W5 of the second active contact AC2 on the first active region AP1.

A bottom surface of the third active contact AC3 on the first active region AP1 may be located at the fourth level LV4. In this case, a contact area between the third active contact AC3 and the first source/drain pattern SD1 may be reduced, and thus, an electric resistance therebetween may be increased. Accordingly, it may be possible to prevent or mitigate against the first source/drain pattern SD1 of the third region RG3 from having an electric resistance lower than a designed value.

Referring to FIGS. 5A and 5B, the third active contact AC3 may have a sixth width W6 that is larger than the width W5 of the second active contact AC2. The third active contact AC3 may be horizontally offset from the first source/drain pattern SD1. For example, a first center line CTL1 of the first source/drain pattern SD1 may be offset from a second center line CTL2 of the third active contact AC3 in the first direction D1.

Since the third active contact AC3 is offset from the first source/drain pattern SD1, an effective size or width of the third active contact AC3 may be reduced. In other words, the bottom surface of the third active contact AC3 may be located at a relatively elevated level (e.g., the fourth level LV4), as shown in FIG. 4B. A contact area between the third active contact AC3 and the first source/drain pattern SD1 may be relatively reduced, as depicted by FIG. 4B. As a result, in the present example embodiments, by offsetting the third active contact AC3 from the first source/drain pattern SD1, it may be possible to effectively reduce a width of the third active contact AC3.

The third active contact AC3 on the second active region AP2 may be horizontally offset from the second source/drain pattern SD2. The bottom surface of the third active contact AC3 on the second active region AP2 may be located at the fourth level LV4. A contact area between the third active contact AC3 and the second source/drain pattern SD2 may be relatively reduced, as depicted by FIG. 4B.

Figure 6:
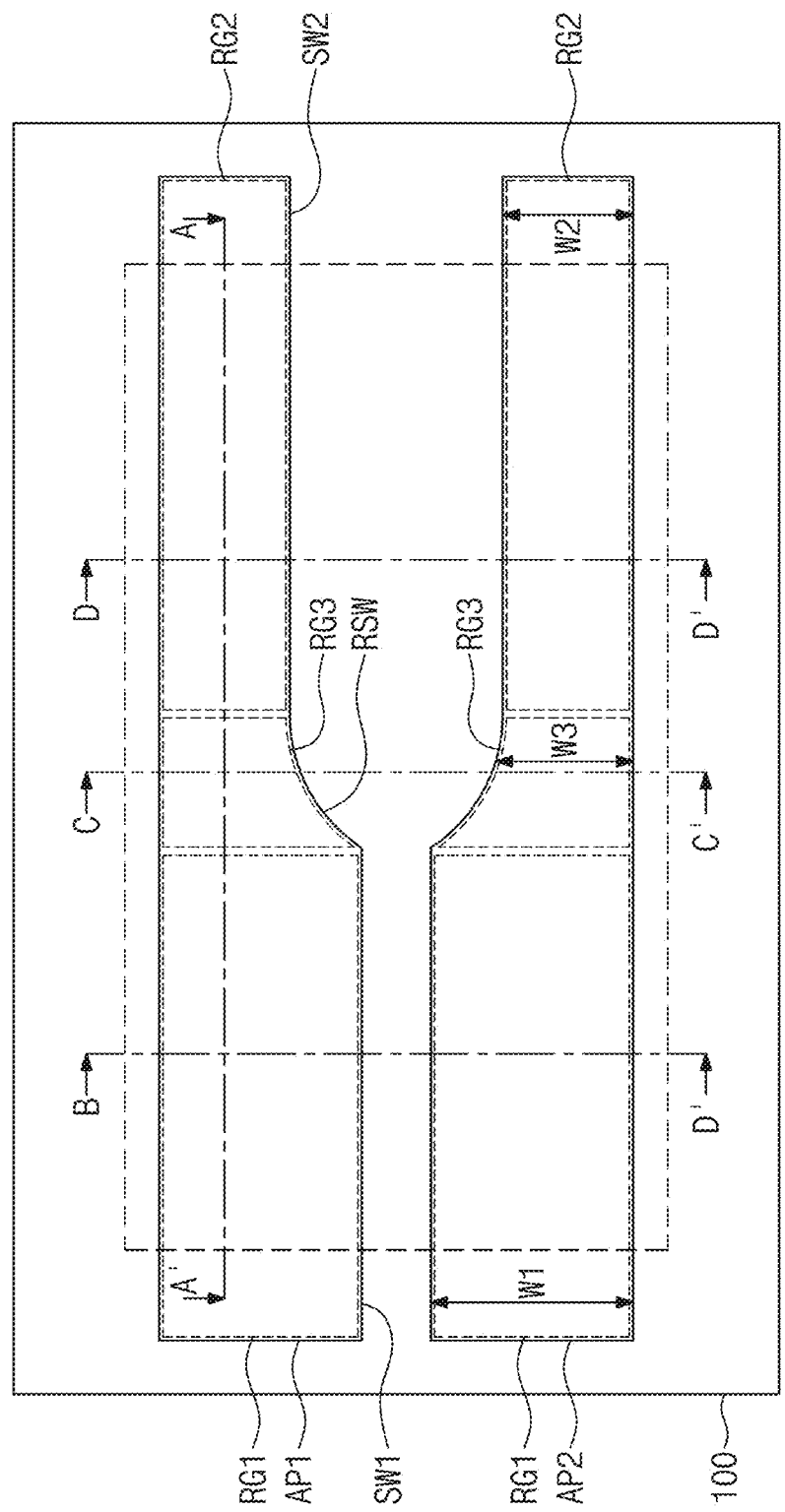
FIGS. 6, 8, and 10 are plan views illustrating a method of fabricating a semiconductor device, according to some example embodiments of the inventive concepts.
Figure 7A:
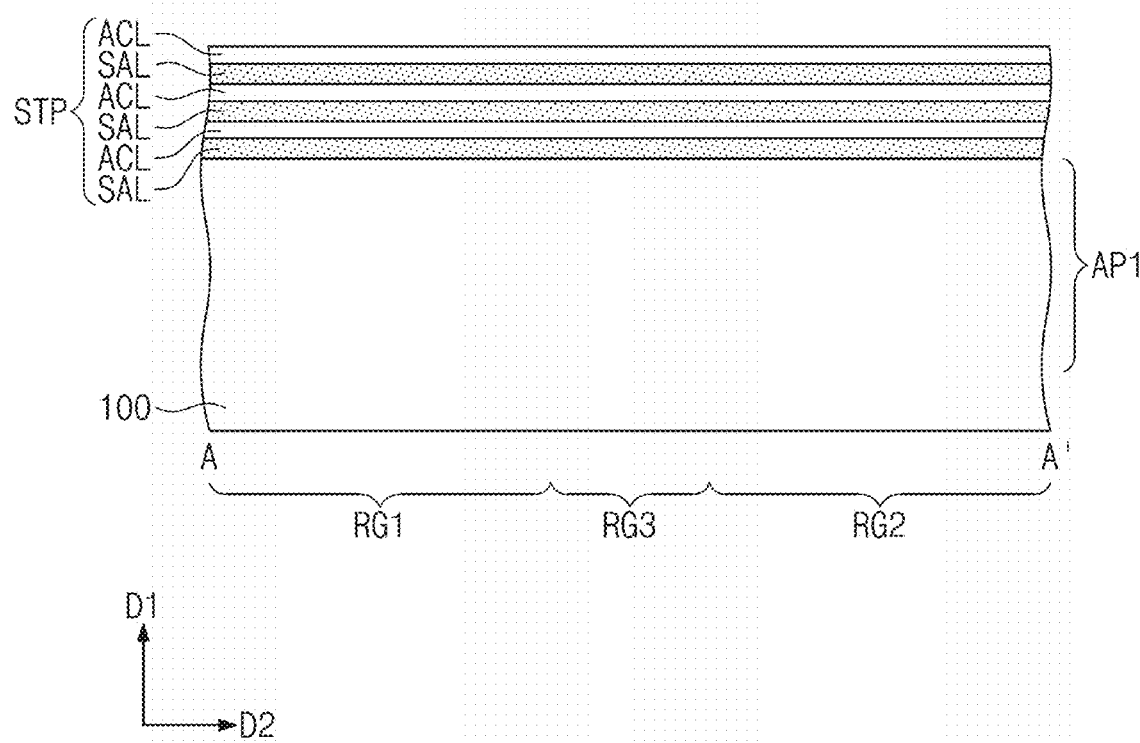
FIGS. 7A, 9A, and 11A are sectional views taken along lines A-A' of FIGS. 6, 8, and 10, respectively.
Figure 7B:
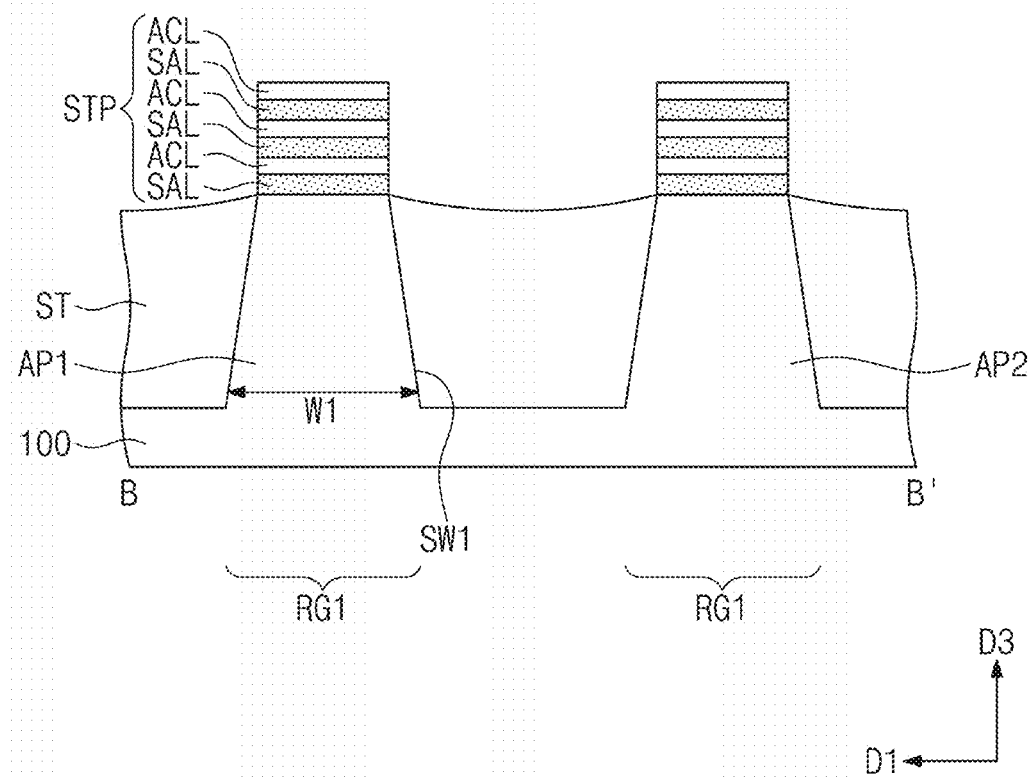
FIGS. 7B, 9B, and 11B are sectional views taken along lines B-B' of FIGS. 6, 8, and 10, respectively.
Figure 7C:
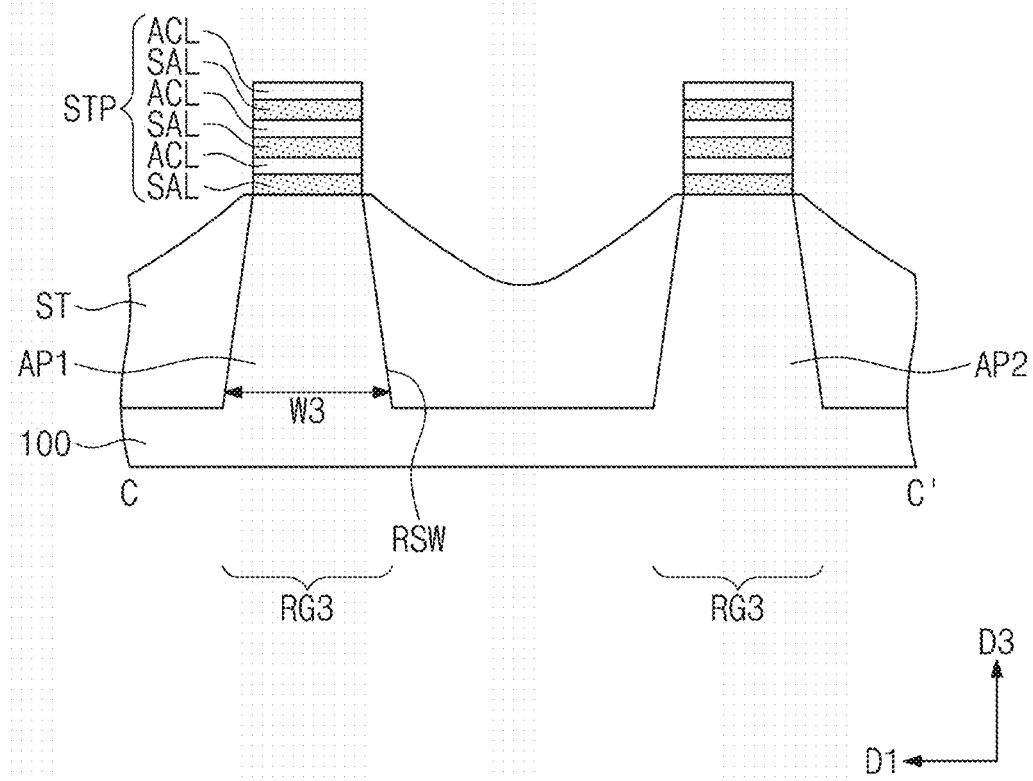
FIGS. 7C, 9C, and 11C are sectional views taken along lines C-C' of FIGS. 6, 8, and 10, respectively.
Figure 7D:
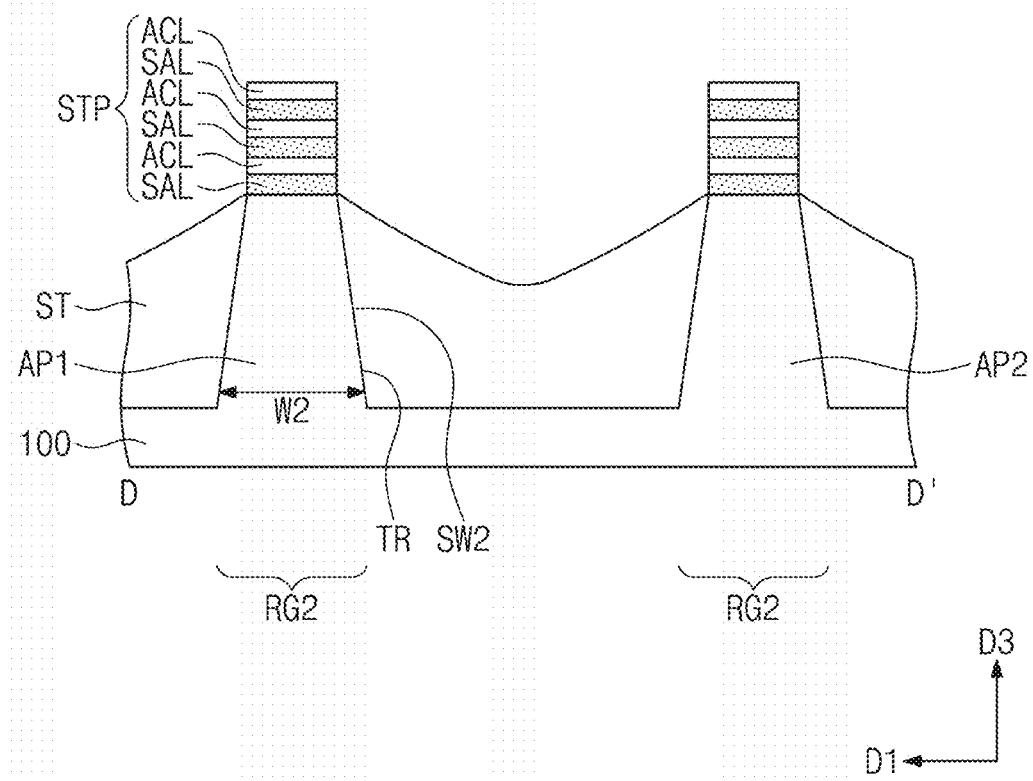
FIGS. 7D, 9D, and 11D are sectional views taken along lines D-D' of FIGS. 6, 8, and 10, respectively.
Figure 8:
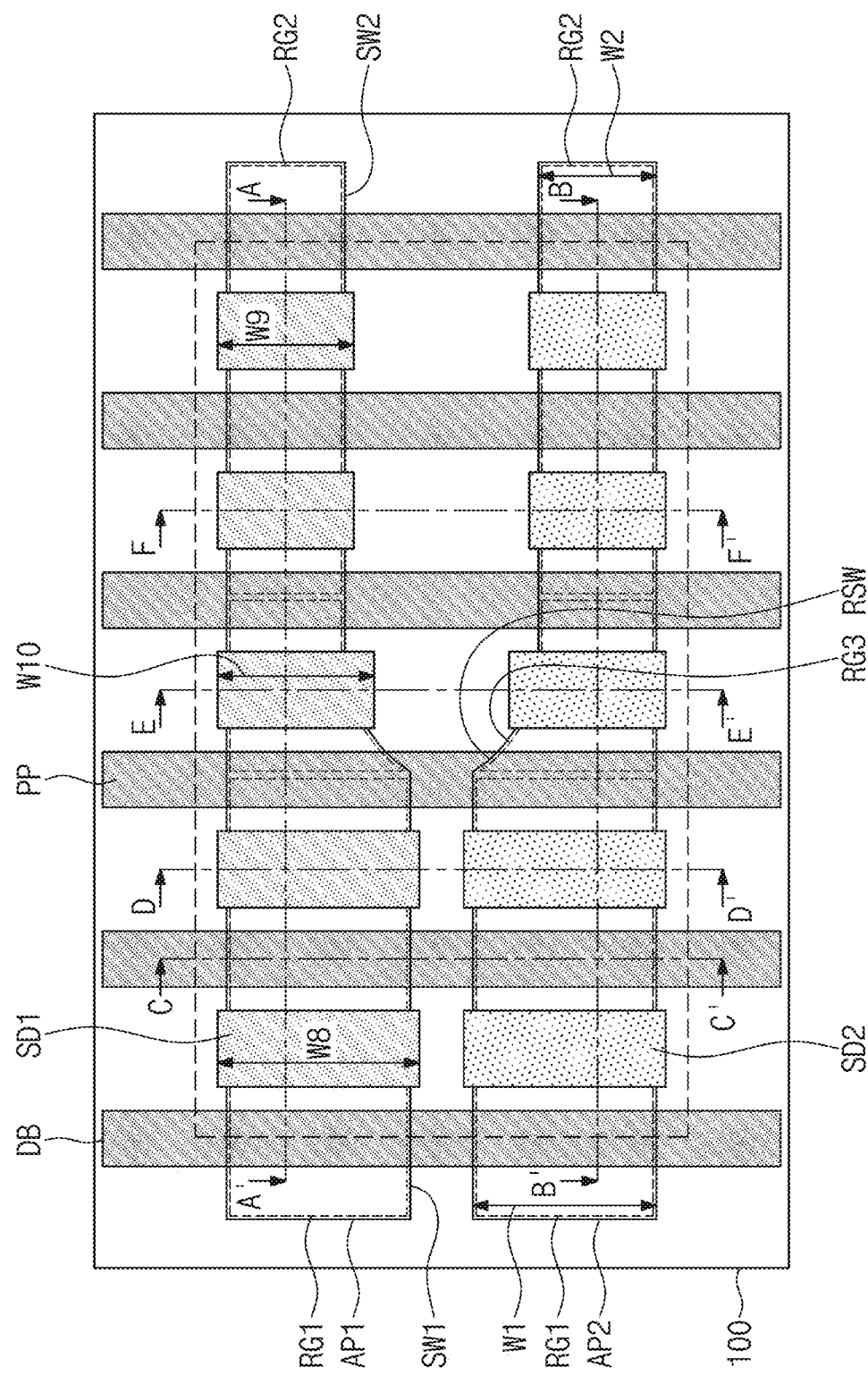
Figure 9A:
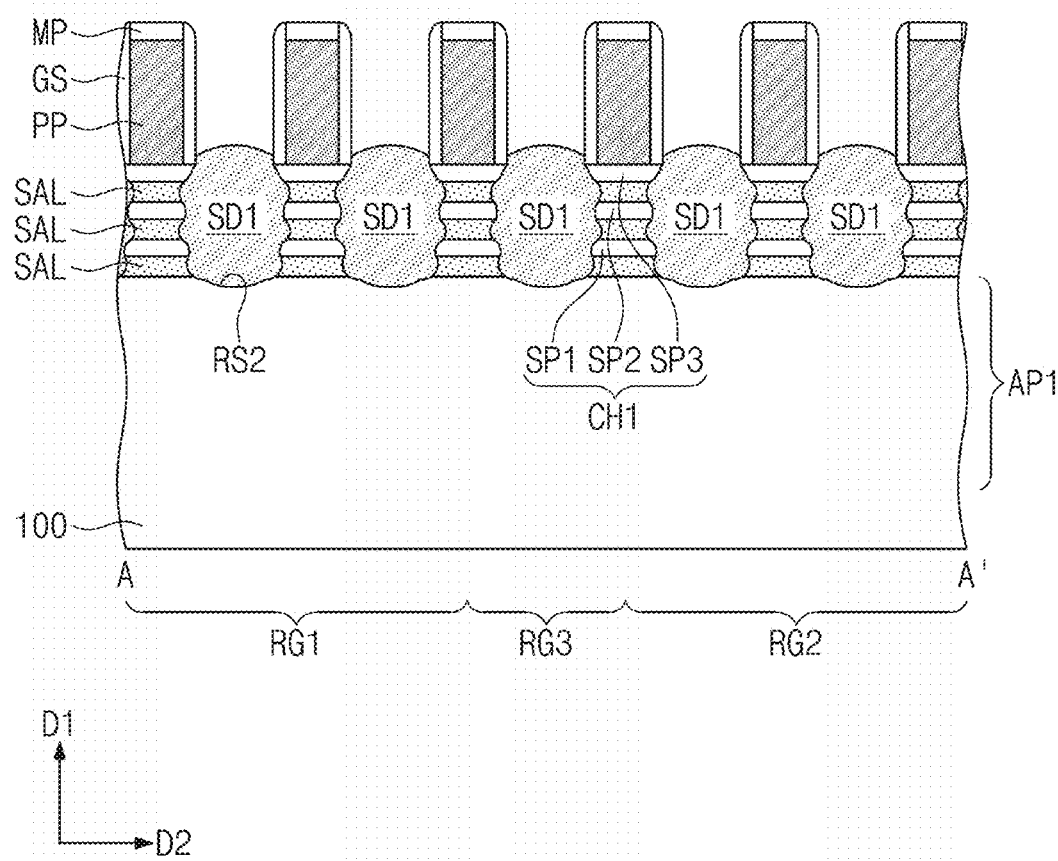
Figure 9B:
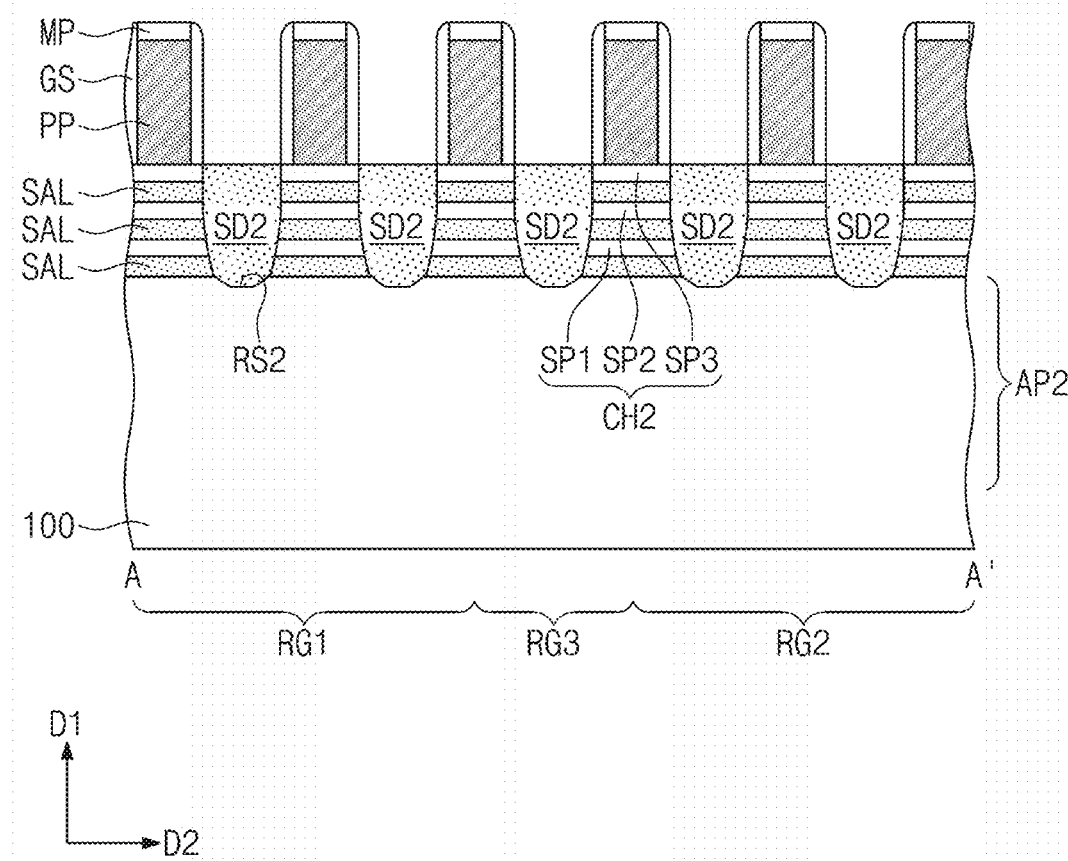
Figure 9C:
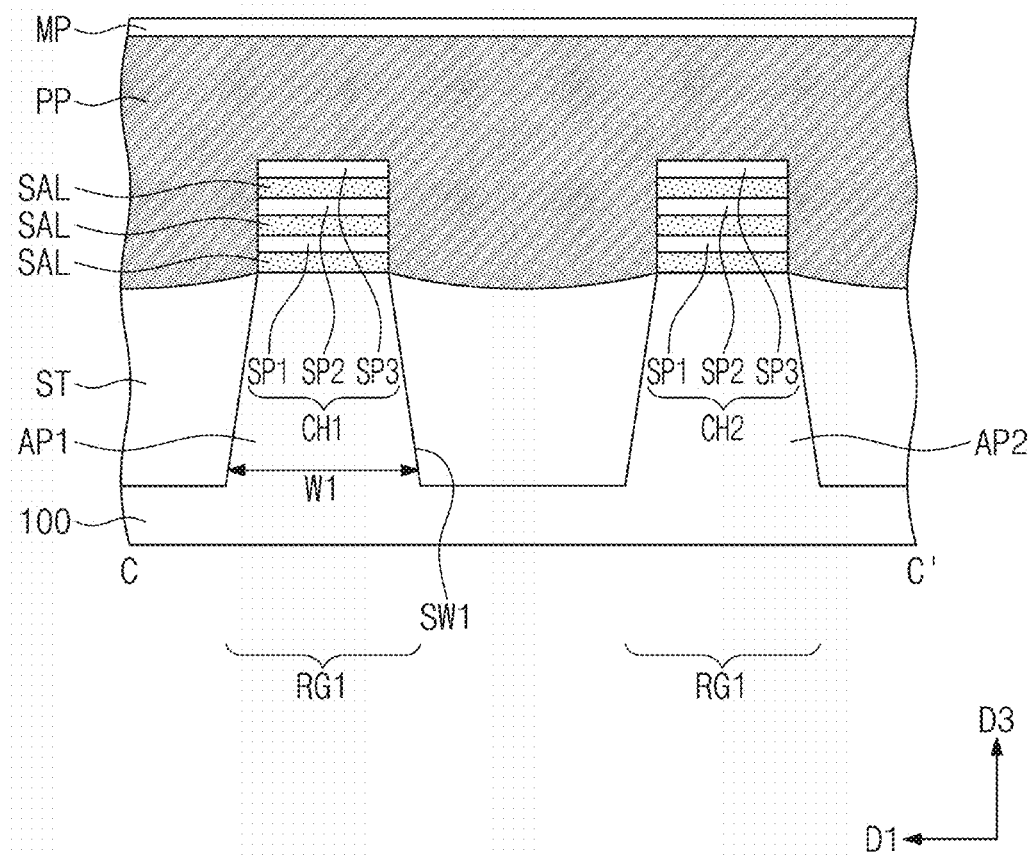
Figure 9D:
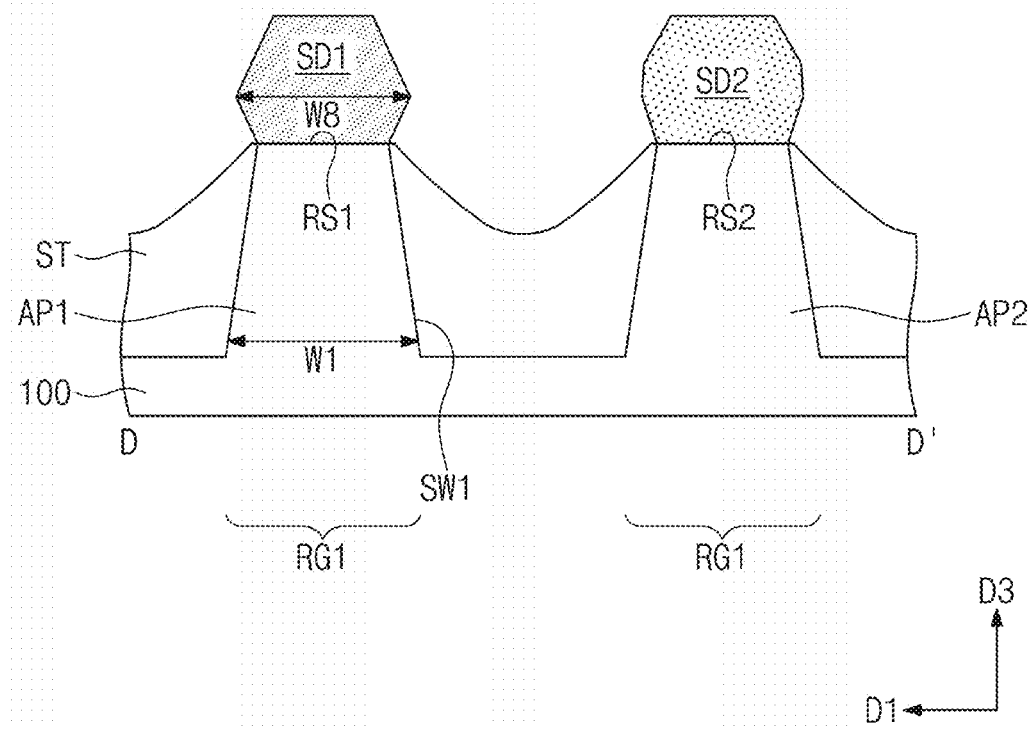
Figure 9E:
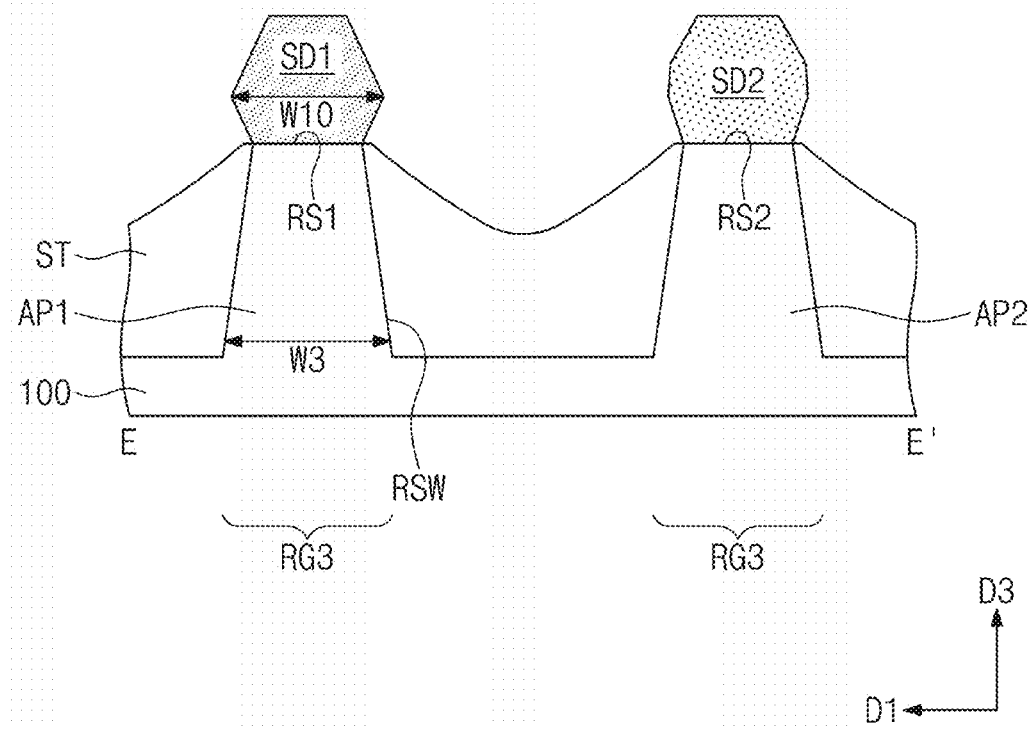
FIGS. 9E and 11E are sectional views taken along lines E-E of FIGS. 8 and 10, respectively.
Figure 9F:
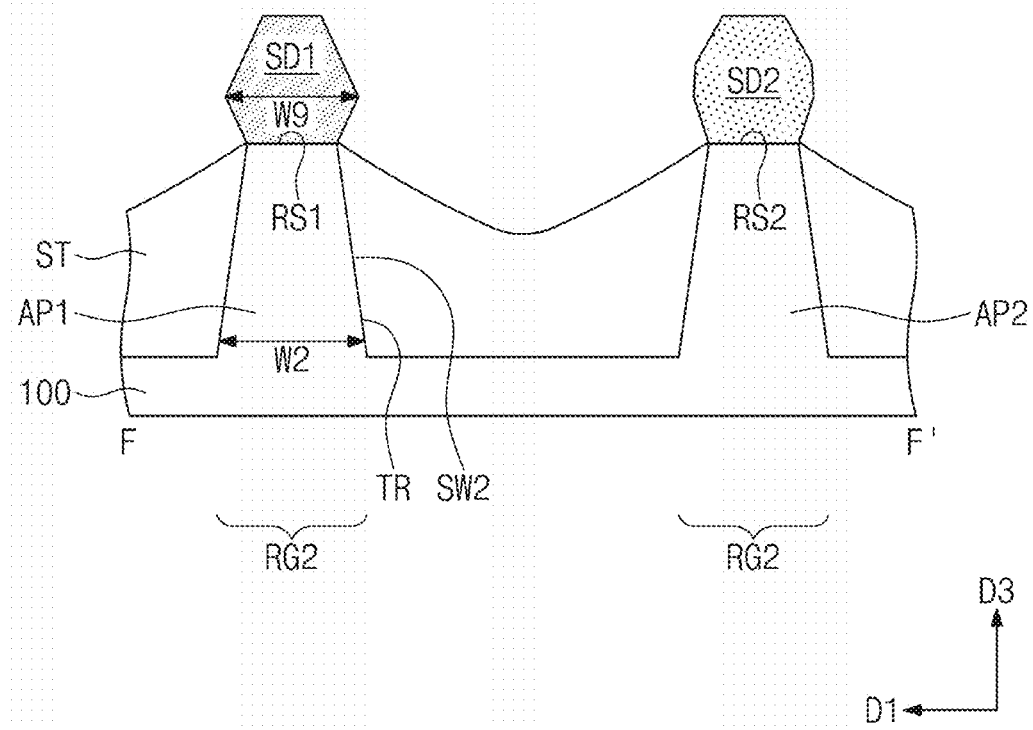
FIGS. 9F and 11F are sectional views taken along lines F-F' of FIGS. 8 and 10, respectively.
Figure 10:
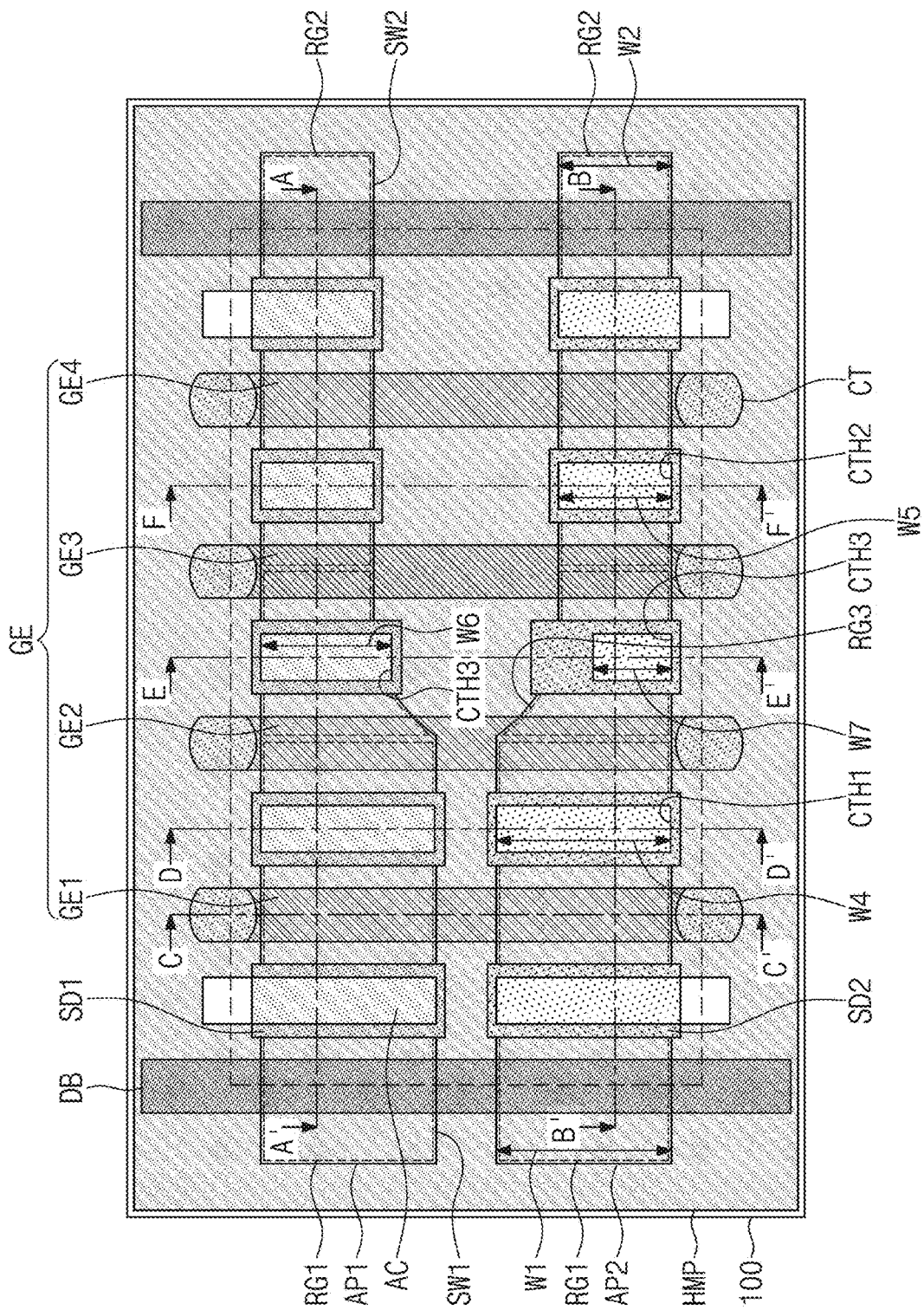
Figure 11A:
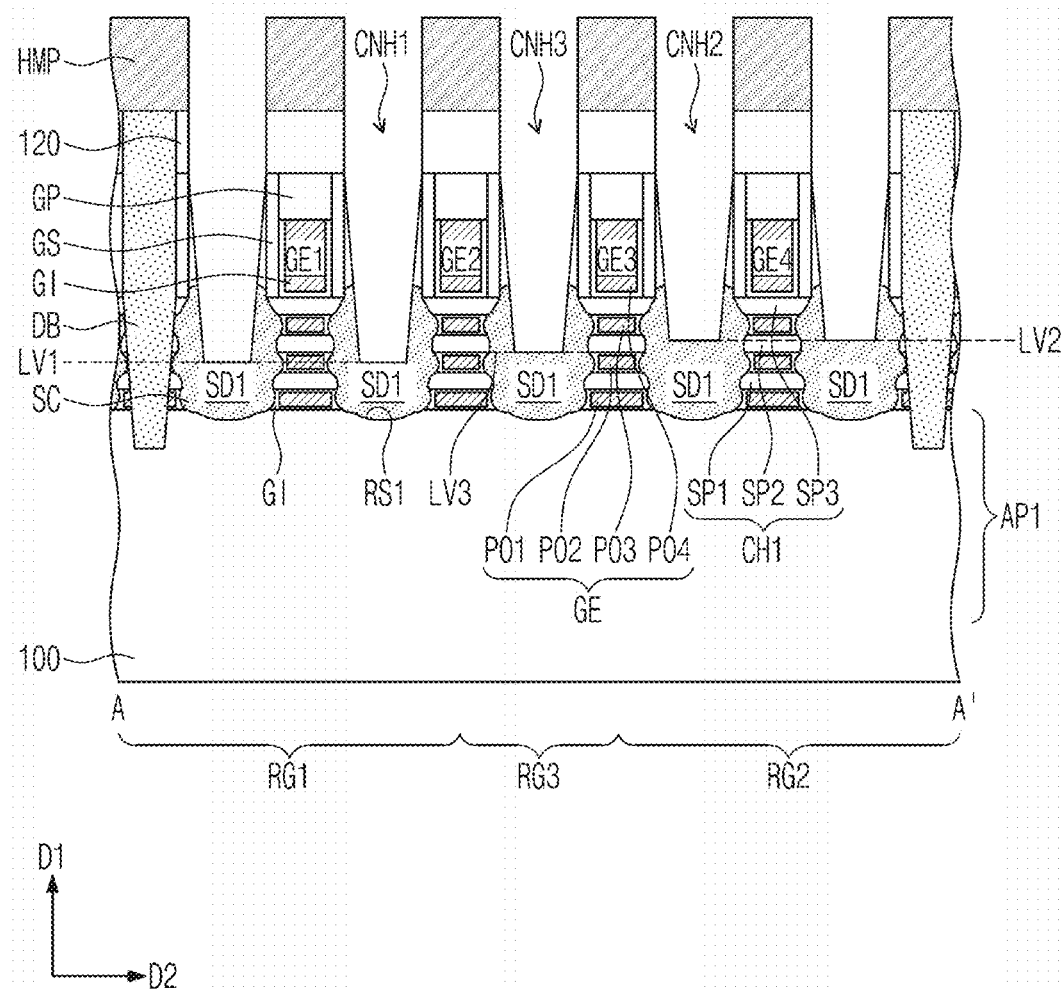
Figure 11B:
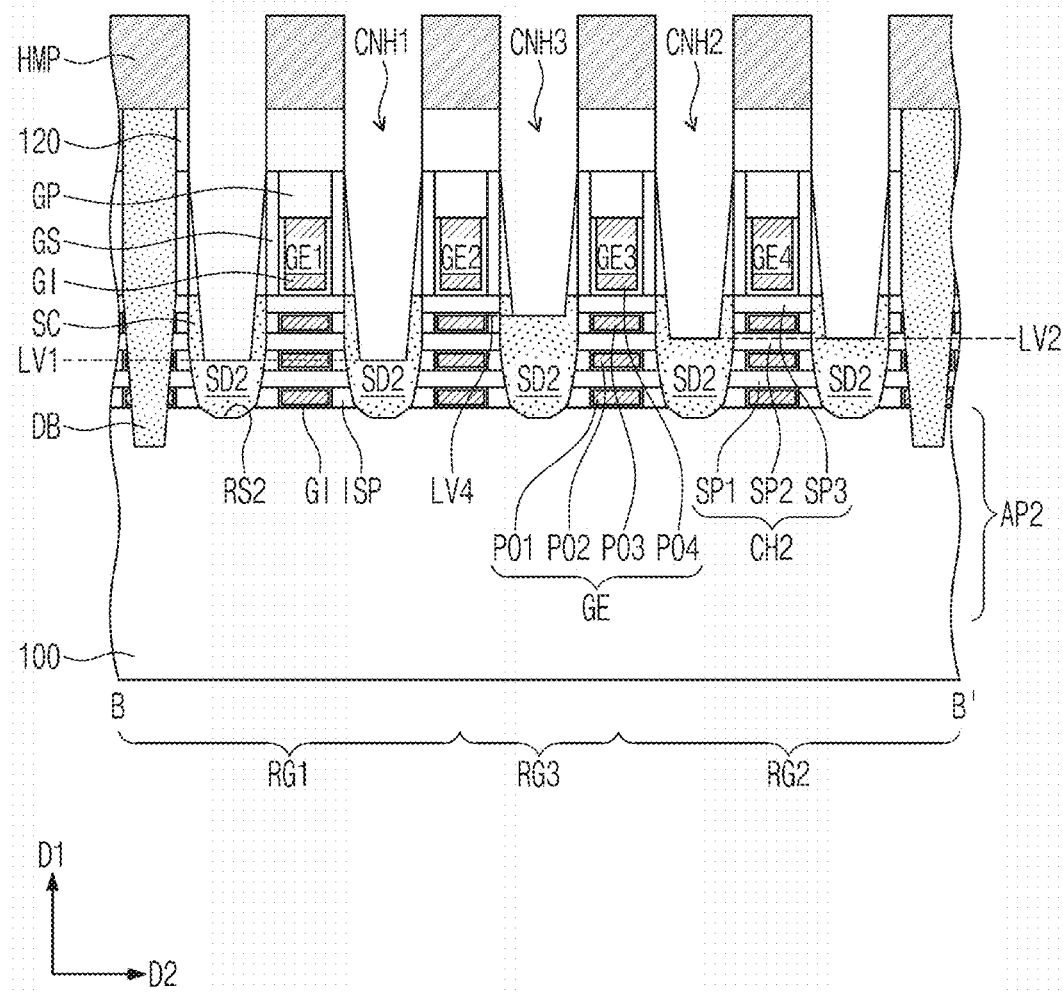
Figure 11C:
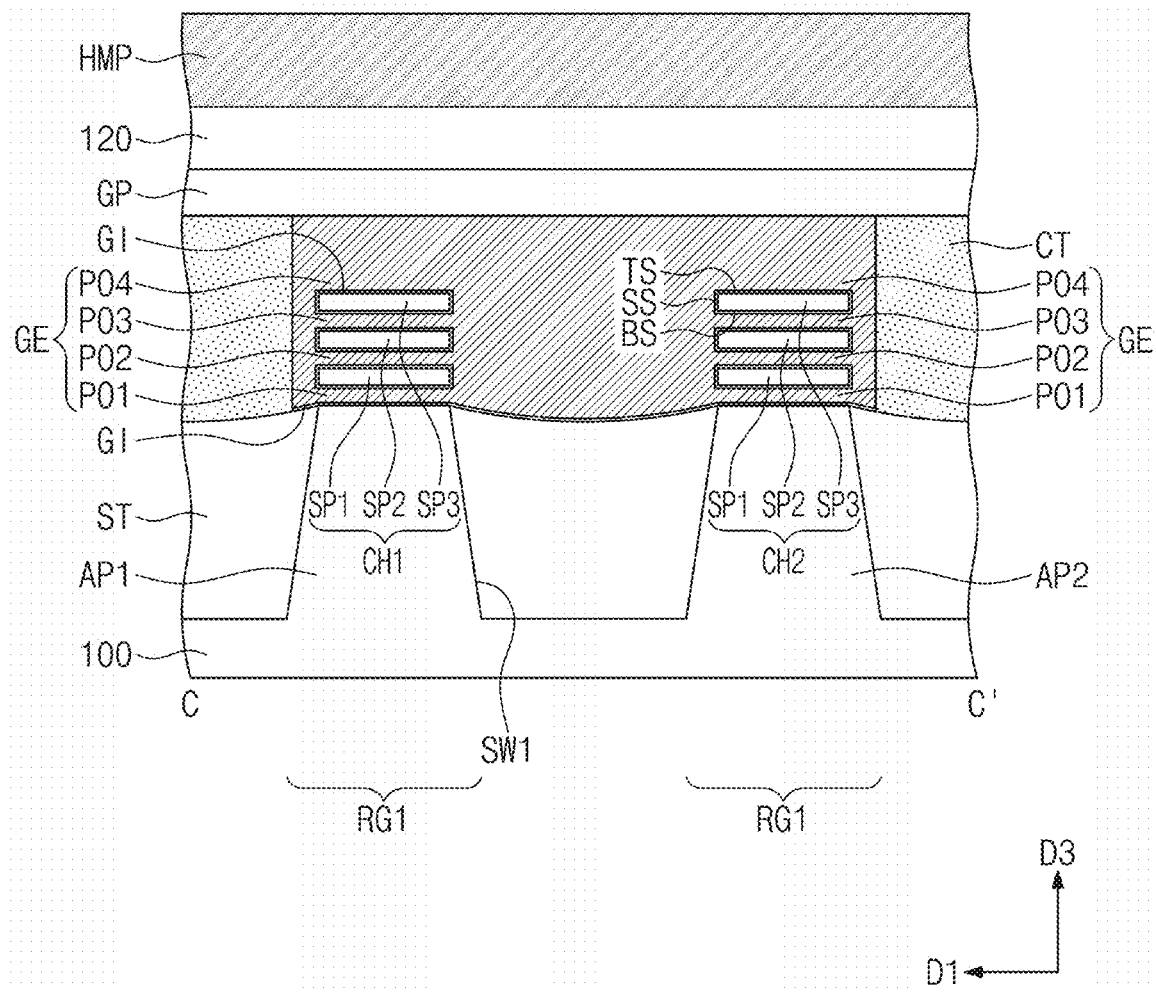
Figure 11D:
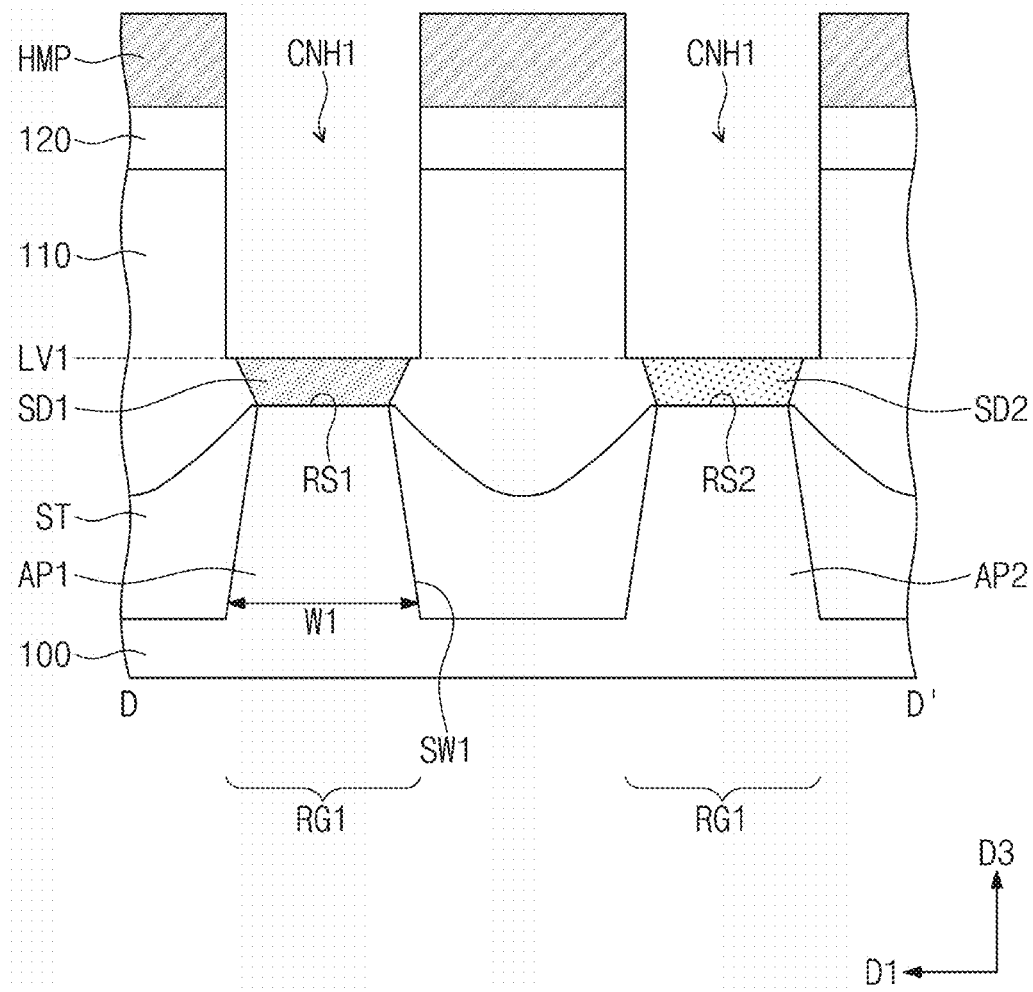
Figure 11E:
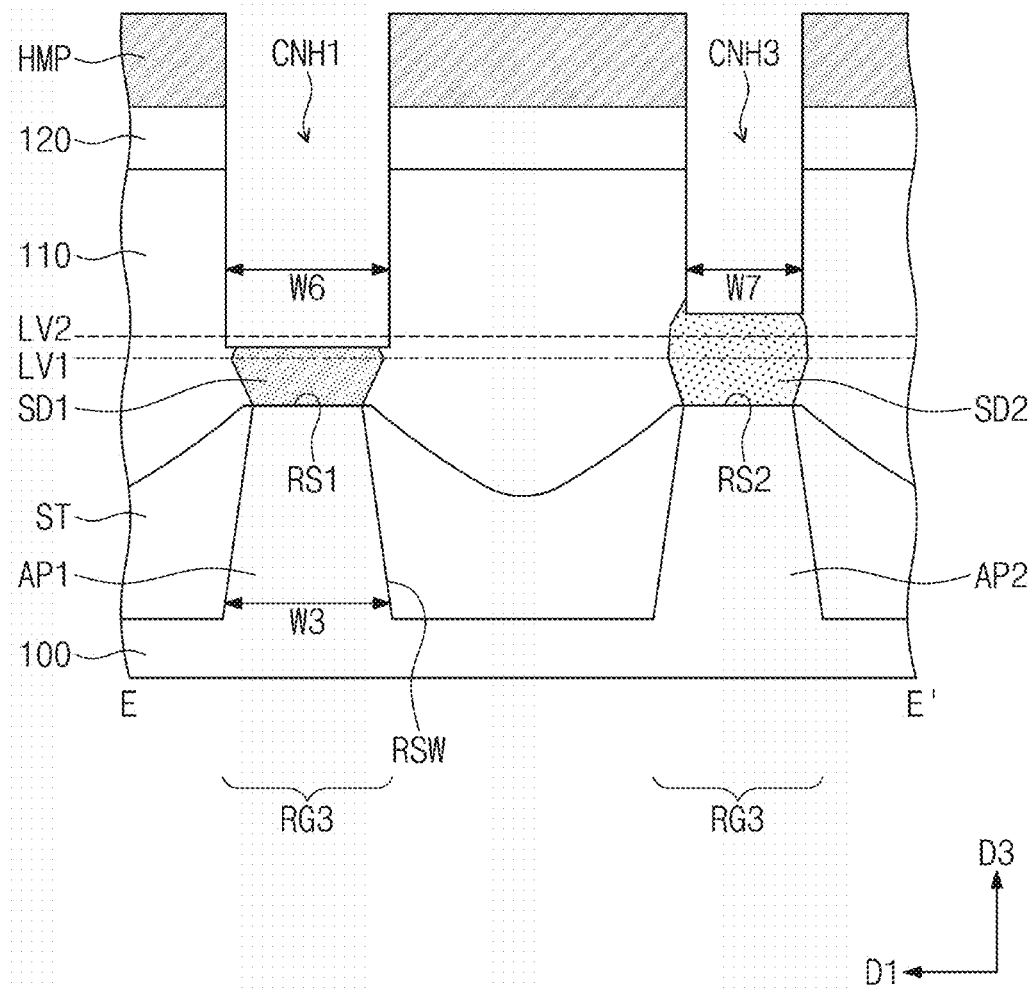
Figure 11F:
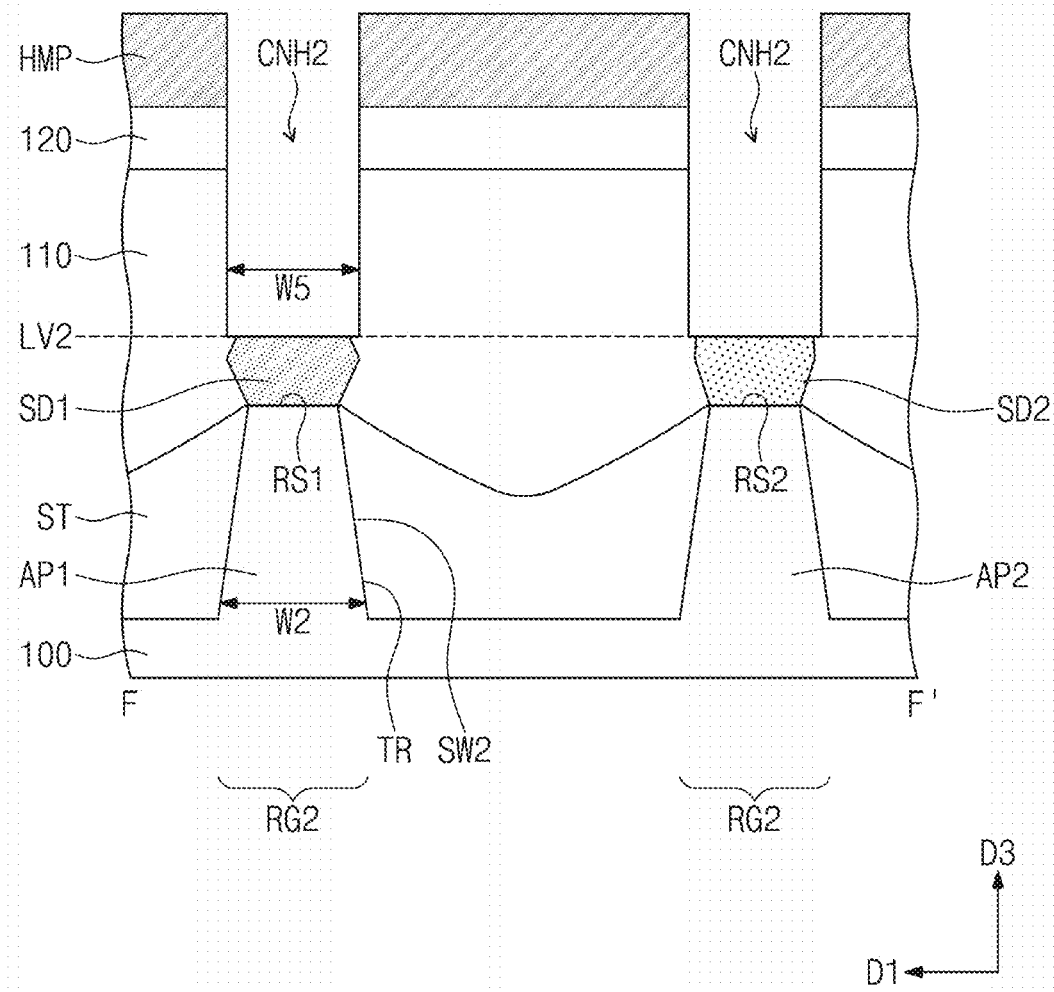

FIGS. 6, 8, and 10 are plan views illustrating a method of fabricating a semiconductor device, according to some example embodiments of the inventive concepts. FIGS. 7A, 9A, and 11A are sectional views taken along lines A-A' of FIGS. 6, 8, and 10, respectively. FIGS. 7B, 9B, and 11B are sectional views taken along lines B-B' of FIGS. 6, 8, and 10, respectively. FIGS. 7C, 9C, and 11C are sectional views taken along lines C-C' of FIGS. 6, 8, and 10, respectively. FIGS. 7D, 9D, and 11D are sectional views taken along lines D-D' of FIGS. 6, 8, and 10, respectively. FIGS. 9E and 11E are sectional views taken along lines E-E of FIGS. 8 and 10, respectively. FIGS. 9F and 11F are sectional views taken along lines F-F' of FIGS. 8 and 10, respectively.

Referring to FIGS. 6 and 7A to 7D, the substrate 100 including the logic cell LC may be provided. Sacrificial layers SAL and active layers ACL may be alternately stacked on the substrate 100. The sacrificial and active layers SAL and ACL may be formed of or include at least one of silicon (Si), germanium (Ge), or silicon germanium (SiGe), but the material of the active layers ACL may be different from that of the sacrificial layers SAL.

For example, the sacrificial layers SAL may be formed of or include silicon-germanium (SiGe), and the active layers ACL may be formed of or include silicon (Si). A germanium concentration of each of the sacrificial layers SAL may range from 10 at % to 30 at %.

A mask pattern may be formed on the substrate 100 to define the first and second active regions AP1 and AP2. The mask pattern may be formed by a photolithography process, which is performed based on the layout of the first and second active regions AP1 and AP2 depicted by FIG. 3A.

A patterning process using the mask pattern as an etch mask may be performed to form the trench TR defining the first and second active regions AP1 and AP2. In some example embodiments, the first and second active regions AP1 and AP2 may be PMOSFET and NMOSFET regions, respectively.

A stacking pattern STP may be formed on each of the first and second active regions AP1 and AP2. The stacking pattern STP may include the sacrificial layers SAL and the active layers ACL, which are alternatingly stacked. The stacking pattern STP may be formed along with the first and second active regions AP1 and AP2, during the patterning process.

Each of the first and second active regions AP1 and AP2 may be formed to include the first region RG1 having the first width W1, the second region RG2 having the second width W2, and the third region RG3 having the third width W3. The third region RG3 may be an intermediate region whose width varies from the first width W1 to the second width W2.

Due to practical issues (e.g., limitation in an exposure process), the first and second active regions AP1 and AP2 may be formed to have the rounded side surface RSW. In other words, the first and second active regions AP1 and AP2 may include the third region RG3 having a gradually-varying width.

The stacking patterns STP may be formed to have a planar shape corresponding to each of the first and second active regions AP1 and AP2. In other words, a width of the stacking pattern STP on the first region RG1 may be larger than a width of the stacking pattern STP on the third region RG3. The width of the stacking pattern STP on the third region RG3 may be larger than a width of the stacking pattern STP on the second region RG2.

The device isolation layer ST may be formed to fill the trench TR. In detail, an insulating layer may be formed on the substrate 100 to cover the first and second active regions AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Referring to FIGS. 8 and 9A to 9F, a plurality of sacrificial patterns PP may be formed on the substrate 100. The sacrificial patterns PP may be provided to cross the stacking patterns STP. Each of the sacrificial patterns PP may be a line- or bar-shaped pattern that is extended in the first direction D1. The sacrificial patterns PP may be arranged, with a specific pitch, in the second direction D2. In some example embodiments, a plurality of sacrificial patterns PP may be formed of or include polysilicon.

In detail, the formation of the sacrificial patterns PP may include forming a sacrificial semiconductor layer on the substrate 100, forming hard mask patterns MP on the sacrificial semiconductor layer, and etching a sacrificial semiconductor layer using the hard mask patterns MP as an etch mask.

A pair of gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. As an example, the gate spacer GS may include a first spacer GS1 on a side surface of the sacrificial pattern PP and a second spacer GS2 on the first spacer GS1.

First recesses RS1 may be formed in the stacking pattern STP on the first active region AP1. Second recesses RS2 may be formed in the stacking pattern STP on the second active region AP2. During the formation of the first and second recesses RS1 and RS2, the device isolation layer ST may also be recessed at both sides of each of the first and second active regions AP1 and AP2 (e.g., see FIG. 9D).

In detail, the first recesses RS1 may be formed by etching the stacking pattern STP on the first active region AP1 using the hard mask patterns MP and the gate spacers GS as an etch mask. The first recess RS1 may be formed between a pair of the sacrificial patterns PP. The second recesses RS2 in the stacking pattern STP on the second active region AP2 may be formed by the same method as that for the first recesses RS1 the first recesses RS1.

Between adjacent ones of the first recesses RS1, the first to third semiconductor patterns SP1, SP2, and SP3, which are sequentially stacked, may be formed from the active layers ACL. The first to third semiconductor patterns SP1, SP2, and SP3, which are sequentially stacked between adjacent ones of the second recesses RS2, may be formed from the active layers ACL. The first to third semiconductor patterns SP1, SP2, and SP3 between adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

The first source/drain patterns SD1 may be formed in the first recesses RS1, respectively. In detail, the first source/drain pattern SD1 may be formed by a first selective epitaxial growth (SEG) process, in which an inner side surface of the first recess RS1 is used as a seed layer. The first SEG process may include a chemical vapor deposition (CVD) process or a molecular beam epitaxy (MBE) process.

The first source/drain pattern SD1 may be formed of or include a semiconductor material (e.g., SiGe) having a lattice constant greater than that of the substrate 100. During the first SEG process, impurities may be injected in an in-situ manner. Alternatively, impurities may be injected into the first source/drain pattern SD1, after the formation of the first source/drain pattern SD1. The first source/drain pattern SD1 may be doped to have a first conductivity type (e.g., a p-type).

The largest width of the first source/drain pattern SD1 on the first region RG1 may be an eighth width W8. The largest width of the first source/drain pattern SD1 on the second region RG2 may be a ninth width W9. The largest width of the first source/drain pattern SD1 on the third region RG3 may be a tenth width W10. The tenth width W10 may be larger than the ninth width W9. The eighth width W8 may be larger than the tenth width W10. In other words, the first source/drain pattern SD1 may be formed to have a size that is proportional to a width of the first active region AP1.

The second source/drain patterns SD2 may be formed in the second recesses RS2, respectively. In detail, the second source/drain pattern SD2 may be formed by a second SEG process, in which an inner surface of the second recess RS2 is used as a seed layer. In some example embodiments, the second source/drain pattern SD2 may be formed of or include the same semiconductor material (e.g., Si) as the substrate 100. The second source/drain pattern SD2 may be doped to have a second conductivity type (e.g., n-type). The inner spacers ISP may be respectively formed between the second source/drain pattern SD2 and the sacrificial layers SAL. The second source/drain pattern SD2 may also be formed to have a size that is proportional to a width of the second active region AP2, like the first source/drain pattern SD1.

Referring to FIGS. 10 and 11A to 11F, the first interlayer insulating layer 110 may be formed to cover the first and second source/drain patterns SD1 and SD2, the hard mask patterns MP, and the gate spacers GS. In some example embodiments, the first interlayer insulating layer 110 may include a silicon oxide layer. The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process.

The sacrificial patterns PP may be replaced with gate electrodes GE. In detail, the exposed sacrificial pattern PP may be selectively removed. As a result of the removal of the sacrificial pattern PP, the sacrificial layers SAL may be exposed. The exposed sacrificial layers SAL may be selectively removed. The gate insulating layer GI and the gate electrode GE may be sequentially formed in an empty space, which is formed by removing the sacrificial pattern PP and the sacrificial layers SAL. The gate insulating layer GI may enclose the first to third semiconductor patterns SP1, SP2, and SP3. The gate capping pattern GP may be formed on the gate electrode GE.

The gate electrode GE may include the first to third portions PO1, PO2, and PO3, which are respectively formed in empty regions formed by removing the sacrificial layers SAL. The gate electrode GE may further include the fourth portion PO4, which is formed in an empty region formed by removing the sacrificial pattern PP.

The second interlayer insulating layer 120 may be formed on the first interlayer insulating layer 110. The second interlayer insulating layer 120 may include a silicon oxide layer. A pair of the division structures DB may be formed at both sides of the logic cell LC. The division structure DB may be provided to penetrate the second interlayer insulating layer 120 and the gate electrode GE and may be extended into the active pattern AP1 or AP2. The division structure DB may be formed of or include an insulating material (e.g., silicon oxide or silicon nitride).

A hard mask layer HMP may be formed on the second interlayer insulating layer 120 to define first to third contact holes CNH1, CNH2, and CNH3. The hard mask layer HMP may be formed using a photolithography process. The first to third contact holes CNH1, CNH2, and CNH3 may be formed by anisotropically etching the first and second interlayer insulating layers 110 and 120 using the hard mask layer HMP as an etch mask.

The first to third contact holes CNH1, CNH2, and CNH3 may be formed to expose the first and second source/drain patterns SD1 and SD2. During the formation of the first to third contact holes CNH1, CNH2, and CNH3, upper portions of the first and second source/drain patterns SD1 and SD2 may be etched by the anisotropic etching process.

The first to third contact holes CNH1, CNH2, and CNH3 may be formed to have different sizes from each other. For example, the first contact hole CNH1 may be formed to have the fourth width W4 in the first direction D1. The second contact hole CNH2 may be formed to have the fifth width W5 in the first direction D1. The third contact hole CNH3 may be formed to have the sixth or seventh width W6 or W7 in the first direction D1. The fourth width W4 may be larger than the fifth width W5. The sixth width W6 may be smaller than the fourth width W4 and may be larger than the fifth width W5. The seventh width W7 may be smaller than the fifth width W5.

Since the first to third contact holes CNH1, CNH2, and CNH3 are formed to have different sizes from each other, them may be different from each other in their depths or bottom levels. The larger the size of the contact hole, the lower the level of the bottom. This is because an increase in size of the contact hole causes an increase of etching amount in the anisotropic etching process.

The bottom of the first contact hole CNH1 may be formed to be located at the first level LV1. The bottom of the second contact hole CNH2 may be formed to be located at the second level LV2. The bottom of the third contact hole CNH3 on the first active region AP1 may be formed to be located at the third level LV3. The bottom of the third contact hole CNH3 on the second active region AP2 may be formed to be located at the fourth level LV4. The first level LV1 may be lower than the second level LV2. The third level LV3 may be higher than the first level LV1 and lower than the second level LV2. The fourth level LV4 may be higher than the second level LV2.

In the present example embodiments, since the bottom of the third contact hole CNH3 on the first active region AP1 is formed at a height lower than the second level LV2, an etching amount of the first source/drain pattern SD1 of the third region RG3 may be relatively increased. Since the first source/drain pattern SD1 is etched, the first source/drain pattern SD1 may have a reduced volume, and in this case, a stress, which is exerted on the first channel pattern CH1 from the first source/drain pattern SD1, may be decreased.

In the present example embodiments, since the bottom of the third contact hole CNH3 on the second active region AP2 is formed at a height higher than the second level LV2, the second source/drain pattern SD2 exposed by the third contact hole CNH3 may have a relatively small area. This may cause a reduction in contact area between the second source/drain pattern SD2 and the third active contact AC3 and an increase in electric resistance between the second source/drain pattern SD2 and the third active contact AC3.

Referring back to FIGS. 1 and 2A to 2F, the first to third active contacts AC1-AC3 may be formed in the first to third contact holes CNH1-CNH3, respectively. The first to third active contacts AC1-AC3 may be formed to have widths and depths corresponding to widths and depths of the first to third contact holes CNH1-CNH3, respectively. The gate contact GC may be formed to penetrate the second interlayer insulating layer 120 and the gate capping pattern GP and to be electrically connected to the gate electrode GE.

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

In a semiconductor device according to some example embodiments of the inventive concepts, an active contact on a tapered region, in which an active region has a gradually varying width, may be adjusted to have a size or position that is different from that of an active contact on another region. In this case, it may be possible to prevent or reduce deterioration of a model-hardware correlation (MHC) caused by the tapered region and to possibly prevent or reduce malfunction of a device. That is, it may be possible to improve reliability characteristics of the semiconductor device. Furthermore, it may be possible to prevent or mitigate against an increase of a leakage current caused by the tapered region and to improve electric characteristics of the semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
an active region on a substrate;
source/drain patterns on the active region;
channel patterns on the active region and connected to the source/drain patterns, each of the channel patterns comprising a plurality of semiconductor patterns vertically stacked to be spaced apart from each other;
gate electrodes, which are respectively on the channel patterns and are extended in a first direction and parallel to each other; and
active contacts, which are electrically and respectively connected to the source/drain patterns,
wherein the active region comprises a first region having a first width, a second region having a second width, and a third region having a third width,
the first width is larger than the third width,
the third width is larger than the second width,
the third region is interposed between the first region and the second region,
the source/drain patterns comprise a first source/drain pattern, a second source/drain pattern, and a third source/drain pattern on the first, second, and third regions, respectively,
the active contacts comprise a first active contact, a second active contact, and a third active contact respectively electrically connected to the first, second, and third source/drain patterns,
a bottom surface of the first active contact is at a first level,
a bottom surface of the second active contact is at a second level higher than the first level, and
a bottom surface of the third active contact is at a third level higher than the second level.

2. The semiconductor device of claim 1, wherein
the first active contact has a fourth width,
the second active contact has a fifth width smaller than the fourth width, and
the third active contact has a sixth width smaller than the fifth width.

3. The semiconductor device of claim 1, wherein the third width of the third region decreases gradually in a direction from the first region toward the second region.

4. The semiconductor device of claim 1, wherein
the first region comprises a first side surface extended in a second direction crossing the first direction,
the second region comprises a second side surface extended in the second direction, and
the third region comprises a rounded side surface connecting the first side surface to the second side surface.

5. The semiconductor device of claim 1, wherein
the first active contact has a fourth width,
the second active contact has a fifth width smaller than the fourth width,
the third active contact has a sixth width larger than the fifth width, and
a center line of the third active contact is offset from a center line of the third source/drain pattern in the first direction.

6. The semiconductor device of claim 1, wherein
a largest width of the first source/drain pattern in the first direction is larger than a largest width of the third source/drain pattern in the first direction, and
the largest width of the third source/drain pattern in the first direction is larger than a largest width of the second source/drain pattern in the first direction.

7. The semiconductor device of claim 1, wherein the second and third source/drain patterns are connected to each other by a corresponding one of the channel patterns that is interposed between the second and third source/drain patterns.

8. A semiconductor device, comprising:
a first active region and a second active region on a substrate, each of the first and second active regions comprising a first region having a first width, a second region having a second width, and a third region having a third width, the first width being larger than the third width, the third width being larger than the second width, the third region being interposed between the first region and the second region;
first channel patterns and first source/drain patterns on the first active region;
second channel patterns and second source/drain patterns on the second active region;
gate electrodes on the first and second channel patterns, the gate electrodes extending in a first direction and parallel to each other; and
active contacts electrically connected to the first and second source/drain patterns, respectively,
wherein each of the first and second channel patterns comprises a plurality of semiconductor patterns vertically stacked to be spaced apart from each other,
the active contacts comprise first active contacts on the first region, second active contacts on the second region, and third active contacts on the third region,
at least one of the first active contacts has a fourth width in the first direction,
at least one of the second active contacts has a fifth width smaller than the fourth width, and
at least one of the third active contacts has a sixth width smaller than the fifth width.

9. The semiconductor device of claim 8, wherein
one of the third active contacts is on the first active region and has a seventh width smaller than the fourth width and larger than the fifth width, and
another of the third active contacts is on the second active region and has the sixth width.

10. The semiconductor device of claim 9, wherein
the first active region is a PMOSFET region, and
the second active region is an NMOSFET region.

11. The semiconductor device of claim 9, wherein a level of a bottom surface of the third active contact on the first active region is lower than a level of a bottom surface of the third active contact on the second active region.

12. The semiconductor device of claim 11, wherein the level of the bottom surface of the third active contact on the second active region is higher than a level of a bottom surface of the at least one of the second active contacts.

13. The semiconductor device of claim 11, wherein the level of the bottom surface of the third active contact on the first active region is lower than a level of a bottom surface of the at least one of the second active contacts.

14. The semiconductor device of claim 8, wherein the third width of the third region decreases gradually in a direction from the first region toward the second region.

15. The semiconductor device of claim 8, wherein
the first region comprises a first side surface extended in a second direction crossing the first direction,
the second region comprises a second side surface extending in the second direction, and
the third region comprises a rounded side surface connecting the first side surface to the second side surface.

16. A semiconductor device, comprising:
a substrate including an active region;
a device isolation layer defining the active region;
source/drain patterns on the active region;
channel patterns on the active region and connected to the source/drain patterns, each of the channel patterns comprising a plurality of semiconductor patterns vertically stacked to be spaced apart from each other;
gate electrodes respectively on the channel patterns and extended in a first direction parallel to each other;
a gate insulating layer interposed between each of the gate electrodes and a corresponding one of the channel patterns;
a gate spacer on a side surface of each of the gate electrodes;
a gate capping pattern on a top surface of each of the gate electrodes;
an interlayer insulating layer on the gate capping pattern;
active contacts penetrate the interlayer insulating layer and are electrically and respectively connected to the source/drain patterns;
a metal-semiconductor compound layer interposed between each of the active contacts and each of the source/drain patterns;
gate contacts, which penetrate the interlayer insulating layer and the gate capping pattern and are electrically and respectively connected to the gate electrodes;
a first metal layer on the interlayer insulating layer, the first metal layer comprising first interconnection lines electrically and respectively connected to the active contacts and the gate contacts; and a second metal layer on the first metal layer,
wherein the second metal layer comprises second interconnection lines electrically connected to the first metal layer,
the active region comprises a first region having a first width, a second region having a second width, and a third region having a third width,
the first width is larger than the third width,
the third width is larger than the second width,
the third region is interposed between the first region and the second region,
the source/drain patterns comprise a first source/drain pattern, a second source/drain pattern, and a third source/drain pattern on the first, second, and third regions, respectively,
the active contacts comprise a first active contact, a second active contact, and a third active contact electrically and respectively connected to the first, second, and third source/drain patterns,
a contact area between the first active contact and the first source/drain pattern is larger than a contact area between the second active contact and the second source/drain pattern, and
the contact area between the second active contact and the second source/drain pattern is larger than a contact area between the third active contact and the third source/drain pattern.

17. The semiconductor device of claim 16, wherein
the first active contact has a fourth width,
the second active contact has a fifth width smaller than the fourth width, and
the third active contact has a sixth width smaller than the fifth width.

18. The semiconductor device of claim 16, wherein the third width of the third region decreases gradually in a direction from the first region toward the second region.

19. The semiconductor device of claim 16, wherein
the first region comprises a first side surface extended in a second direction crossing the first direction,
the second region comprises a second side surface extended in the second direction, and
the third region comprises a rounded side surface connecting the first side surface to the second side surface.

20. The semiconductor device of claim 16, wherein
the first active contact has a fourth width,
the second active contact has a fifth width smaller than the fourth width,
the third active contact has a sixth width larger than the fifth width, and
a center line of the third active contact is offset from a center line of the third source/drain pattern in the first direction.

* * * * *